(12) United States Patent
Fujimoto et al.

(10) Patent No.: US 12,197,261 B2
(45) Date of Patent: Jan. 14, 2025

(54) INFORMATION PROCESSING APPARATUS

(71) Applicant: Kioxia Corporation, Tokyo (JP)

(72) Inventors: Akihisa Fujimoto, Sagamihara (JP);
Atsushi Kondo, Yokohama (JP)

(73) Assignee: Kioxia Corporation, Tokyo (JP)

( * ) Notice: Subject to any disclaimer, the term of this patent is extended or adjusted under 35 U.S.C. 154(b) by 296 days.

(21) Appl. No.: 17/931,710

(22) Filed: Sep. 13, 2022

(65) Prior Publication Data
US 2023/0244288 A1 Aug. 3, 2023

(30) Foreign Application Priority Data
Jan. 31, 2022 (JP) .................. 2022-013273

(51) Int. Cl.
| | |
|---|---|
| G06F 1/26 | (2006.01) |
| G11C 5/14 | (2006.01) |
| G11C 16/04 | (2006.01) |
| G11C 16/30 | (2006.01) |
| H02M 3/04 | (2006.01) |

(52) U.S. Cl.
CPC ............. *G06F 1/26* (2013.01); *H02M 3/04* (2013.01); *G11C 5/147* (2013.01); *G11C 16/0483* (2013.01); *G11C 16/30* (2013.01)

(58) Field of Classification Search
CPC ....... G06F 1/26; G11C 16/0483; G11C 16/30; G11C 5/147; H02M 3/04
See application file for complete search history.

(56) References Cited

U.S. PATENT DOCUMENTS

| | | | |
|---|---|---|---|
| 6,456,557 B1 * | 9/2002 | Dadashev | G11C 16/30 365/185.09 |
| 2003/0235058 A1 * | 12/2003 | Toyoshima | G05F 1/56 363/13 |
| 2011/0235455 A1 * | 9/2011 | Pan | G11C 11/4097 330/293 |
| 2012/0062195 A1 | 3/2012 | Ting | |
| 2017/0126118 A1 * | 5/2017 | Duong | G05F 1/575 |
| 2020/0327920 A1 | 10/2020 | Fujimoto et al. | |
| 2021/0055866 A1 | 2/2021 | Fujimoto et al. | |

(Continued)

FOREIGN PATENT DOCUMENTS

| | | |
|---|---|---|
| EP | 4 113 310 A1 | 1/2023 |
| JP | 2001-222689 A | 8/2001 |
| JP | 5680014 B2 | 3/2015 |

(Continued)

*Primary Examiner* — Terrell S Johnson
(74) *Attorney, Agent, or Firm* — Oblon, McClelland, Maier & Neustadt, L.L.P.

(57) ABSTRACT

According to one embodiment, an information processing apparatus includes a connecting portion connectable to a removable memory device and a power supply circuit configured to apply a first voltage and a second voltage to the removable memory device. When the removable memory device is connected to the connecting portion, one of a pair of first feedback wires is electrically connected to one of the first power supply terminals to which the first voltage is applicable, and the other of the pair of first feedback wires is electrically connected to one of the power supply ground terminals connectable to a ground level, the power supply circuit is configured to control the first voltage, based on a voltage between the pair of first feedback wires.

12 Claims, 14 Drawing Sheets

(56) References Cited

U.S. PATENT DOCUMENTS

2021/0334617 A1    10/2021    Fujimoto et al.

FOREIGN PATENT DOCUMENTS

| JP | WO 2020/149104 A1 | 7/2020 |
|----|-------------------|--------|
| JP | 2020-173765 A | 10/2020 |
| JP | 2021-140855 A | 9/2021 |
| JP | 2022-110852 A | 7/2022 |
| WO | WO 2021/171712 A1 | 9/2021 |

* cited by examiner

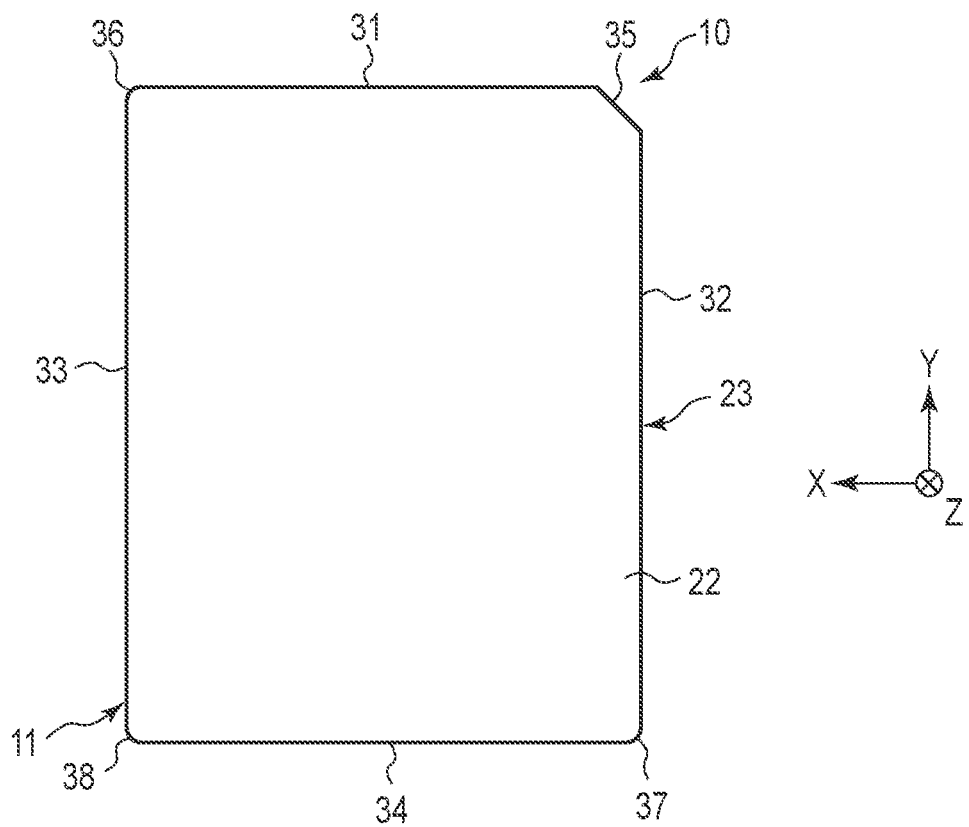
F I G. 2C
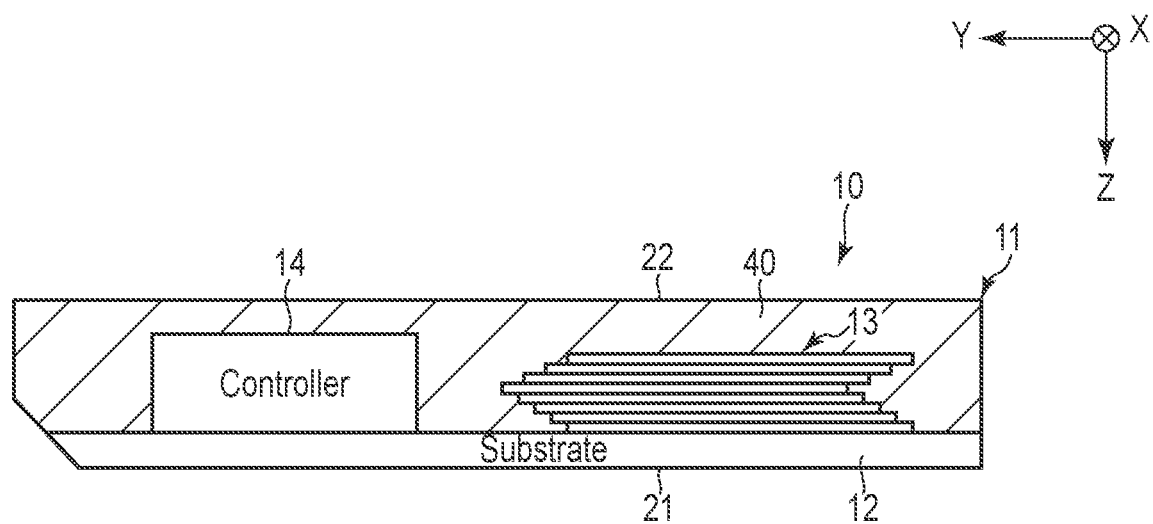
F I G. 3

| Power configuration | Voltage Range | | |
|---|---|---|---|
| | Minimum [V] | Nominal [V] | Maximum [V] |
| PWR_1 | 2.40 | 2.50 | 2.70 |
| PWR_2 | 1.14 | 1.20 | 1.26 |

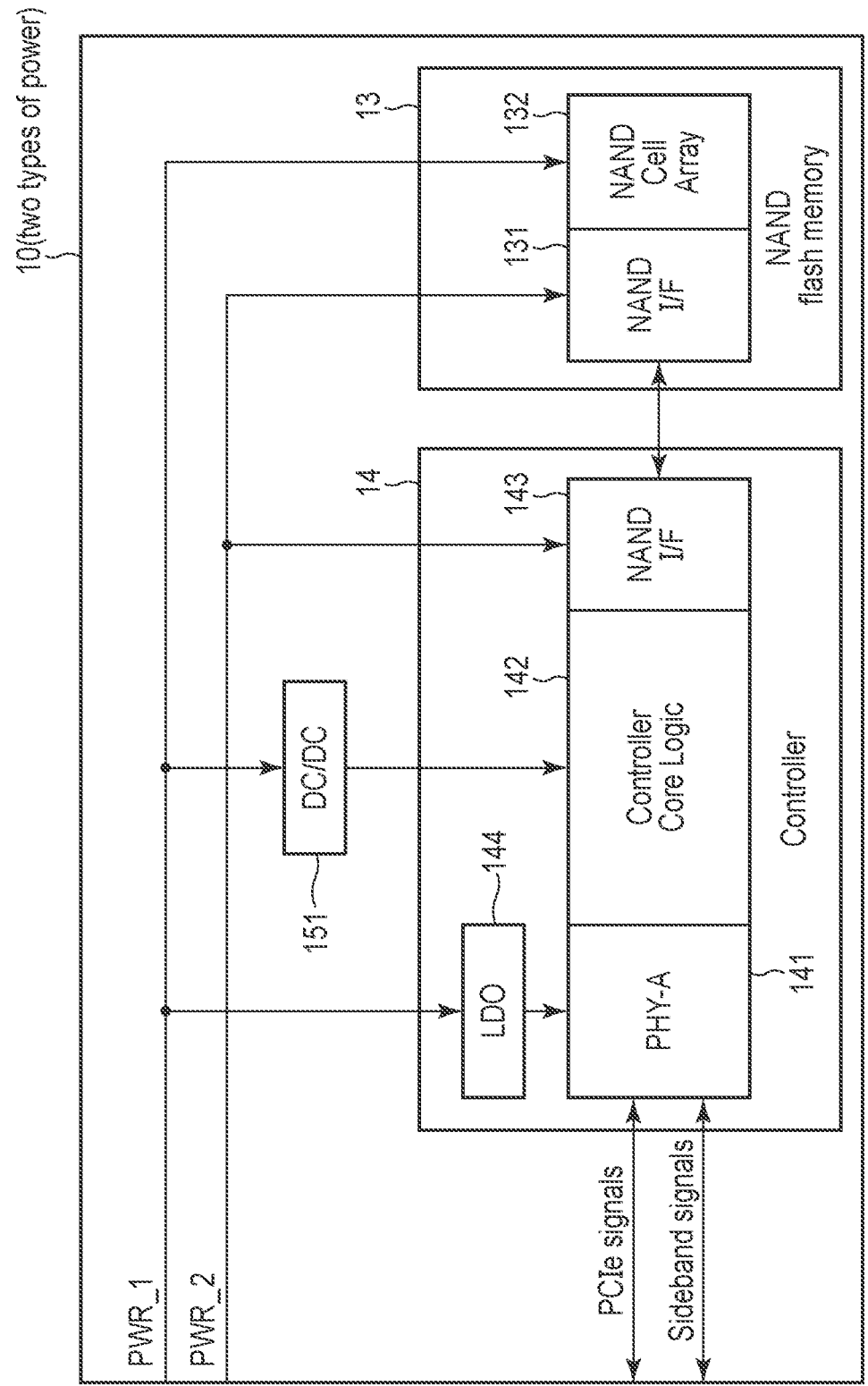
F I G. 9

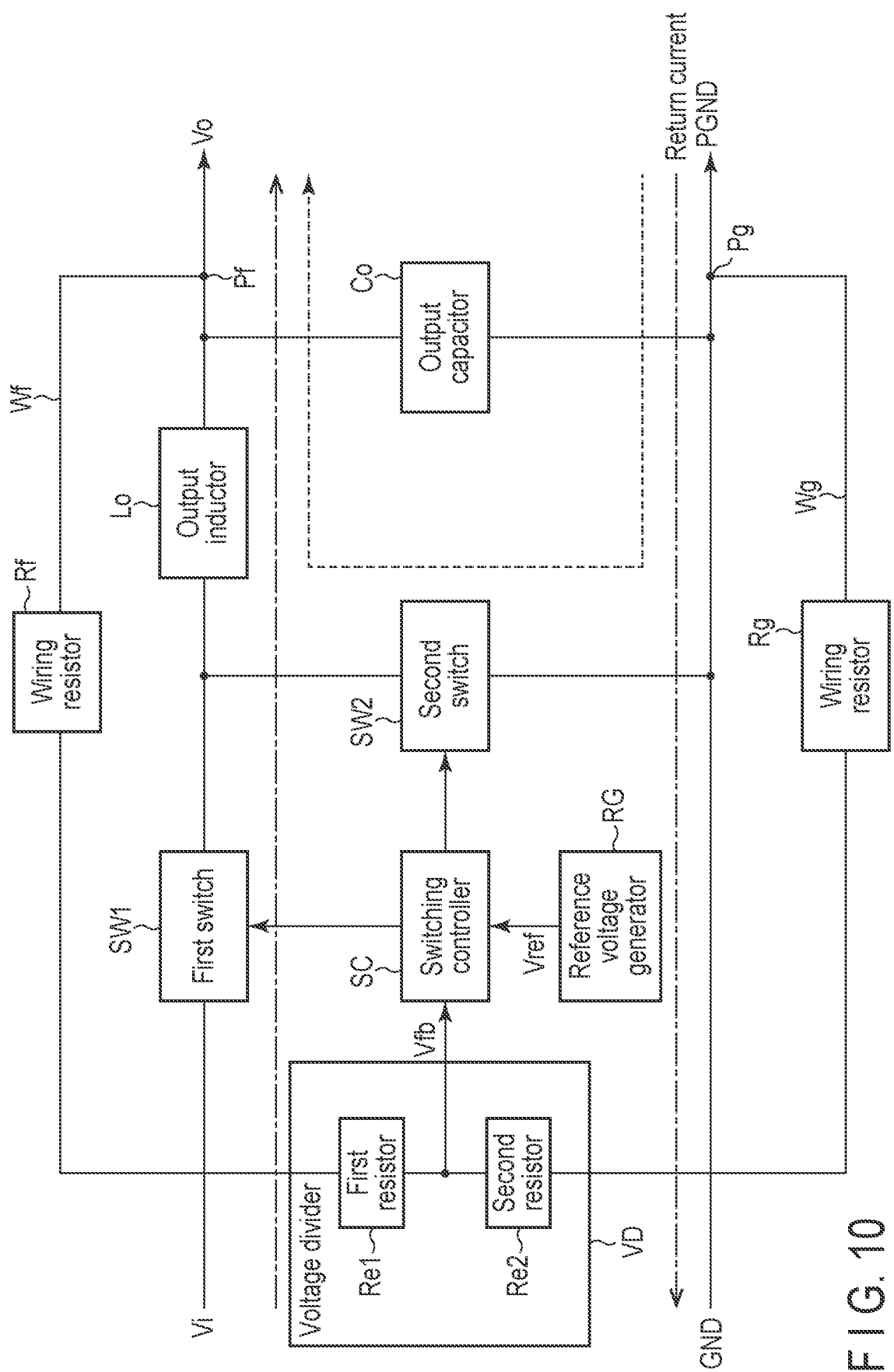
F I G. 10

INFORMATION PROCESSING APPARATUS

CROSS-REFERENCE TO RELATED APPLICATIONS

This application is based upon and claims the benefit of priority from Japanese Patent Application No. 2022-013273, filed Jan. 31, 2022, the entire contents of which are incorporated herein by reference.

FIELD

Embodiments described herein relate generally to an information processing apparatus which supplies a removable memory device with multiple types of power.

BACKGROUND

In recent years, small, high-speed, and large-capacity removable memory devices have been developed.

For example, removable memory devices operating on multiple types of power having different voltages are known as the removable memory devices.

Such a removable memory device is connected to a host via a socket, and thus is easily influenced by voltage drops compared to a ball grid array (BGA) memory device. Thus, there is a demand for a new technique for stably applying voltage to removable memory devices.

BRIEF DESCRIPTION OF THE DRAWINGS

FIG. 2C is a plan view of a second surface of the removable memory device according to the embodiment.

FIG. 3 illustrates a configuration example of the removable memory device according to the embodiment.

FIG. 9 is a block diagram illustrating a power configuration example of the removable memory device operating on two types of power according to the embodiment.

FIG. 10 illustrates a configuration example of a step-down switching regulator.

DETAILED DESCRIPTION

In general, according to one embodiment, an information processing apparatus comprises a connecting portion connectable to a removable memory device and a power supply circuit configured to apply a first voltage and a second voltage different from the first voltage to the removable memory device. The removable memory device includes first power supply terminals to which the first voltage is applicable, second power supply terminals to which the second voltage is applicable, and power supply ground terminals connectable to a ground level. The first power supply terminals may be electrically connected to each other, the power supply ground terminals are electrically connected to each other. The power supply circuit comprises a first wire connected to an output node of the first voltage against a power ground, a second wire connected to an output node of the second voltage against the power ground, a ground wire connected to a return node of the power ground, and a pair of first feedback wires connected to inputs of a first voltage divider. When the removable memory device is connected to the connecting portion, one of the pair of first feedback wires is electrically connected to one of the first power supply terminals via the connecting portion, and the first wire is electrically connected to another terminal of the first power supply terminals via the connecting portion. When the removable memory device is connected to the connecting portion, the other of the pair of first feedback wires is electrically connected to one of the power supply ground terminals via the connecting portion, and the ground wire is electrically connected to another terminal of the power supply ground terminals via the connecting portion. When the removable memory device is connected to the connecting portion, the second wire is electrically connected to at least one of the second power supply terminals via the connecting portion. When the removable memory device is connected to the connecting portion, the power supply circuit is configured to control the first voltage, based on a voltage between the pair of first feedback wires.

Embodiments will be described hereinafter with reference to the accompanying drawings.

Figure 1:
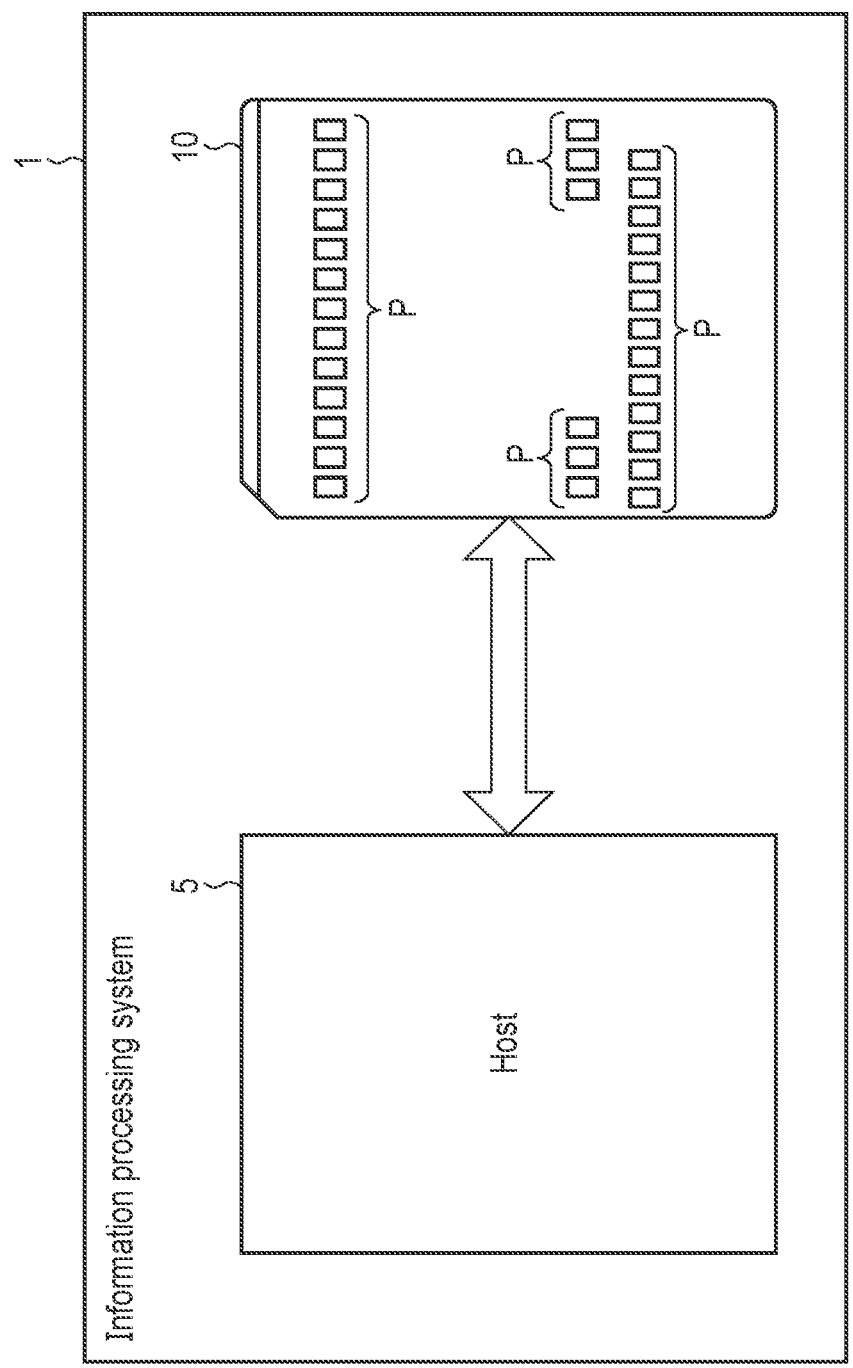
FIG. 1 illustrates a configuration example of an information processing system according to an embodiment.

FIG. 1 illustrates a configuration example of an information processing system 1 according to an embodiment. As illustrated in FIG. 1, the information processing system 1 includes a host 5 (i.e., host device) and a removable memory device 10. The removable memory device 10 is connectable to various information processing apparatuses such as a personal computer and a mobile device functioning as the host 5. The removable memory device 10 are provided with terminals P. and the terminals P are electrically connected to a printed circuit board in the host 5 via a socket in the host 5.

Figure 2A:
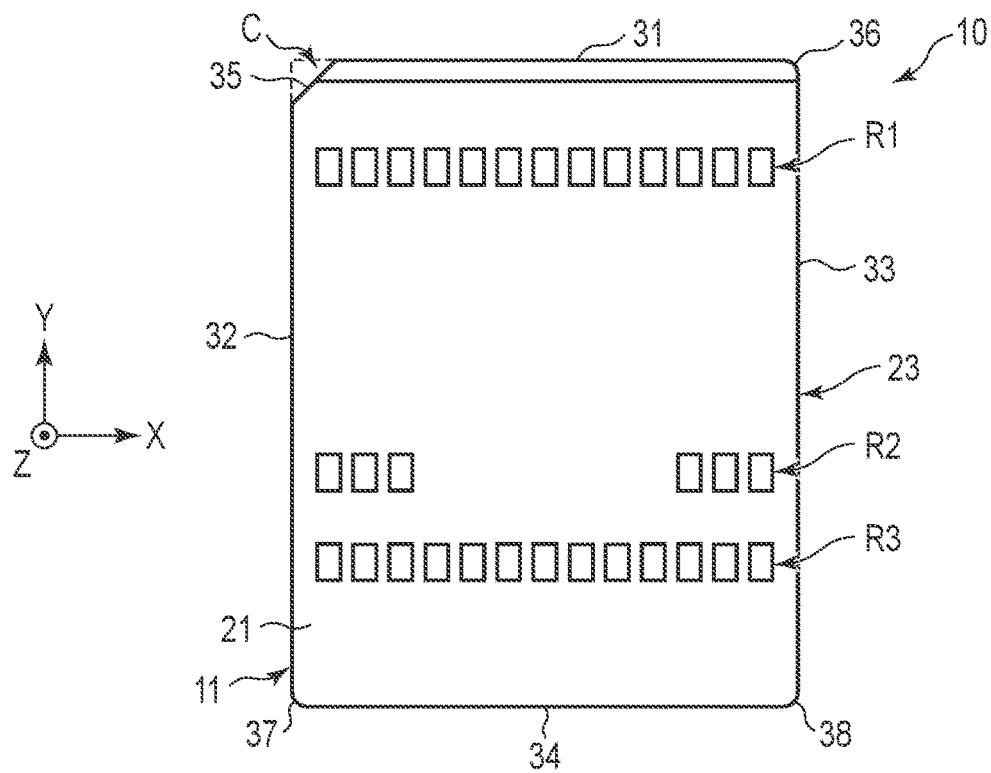
FIG. 2A is a plan view of a first surface of a removable memory device according to the embodiment.
Figure 2B:
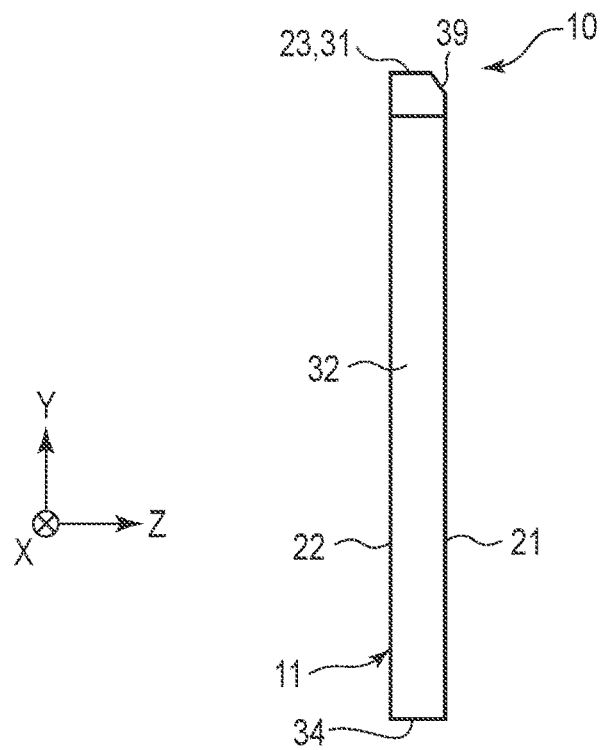
FIG. 2B is a side view of the removable memory device according to the embodiment.

The outer shape of the removable memory device 10 according to the embodiment will be described next with reference to FIG. 2A, FIG. 2B, and FIG. 2C. FIG. 2A is a plan view illustrating one surface of the removable memory device 10. FIG. 2B is a side view illustrating a side surface of the removable memory device 10. FIG. 2C is a plan view illustrating another surface of the removable memory device 10.

In this specification, an X-axis, a Y-axis, and a Z-axis are defined. The X-axis, the Y-axis, and the Z-axis are orthogonal to each other. The X-axis extends along the width of the removable memory device 10. The Y-axis extends along the length (i.e., height) of the removable memory device 10. The Z-axis extends along the thickness of the removable memory device 10.

The removable memory device 10 is a memory device which is connectable to the socket of the host 5 and is detachable from the socket of the host 5. The removable memory device 10 is, for example, inserted in the socket of the host 5 and thereby connected to the socket. The removable memory device 10 is configured to operate on multiple types of power supplied from the host 5. The multiple types of power have different voltages. The multiple types of power supplied from the host 5 to the removable memory device 10, or power supply wires for supplying the multiple types of power from the host 5 to the removable memory device 10 may be referred to as power rails.

For example, when the removable memory device 10 is a memory device configured to operate on two types of power supplied from the host 5, first power having a first voltage is supplied from a first host power supply in the host 5 to the removable memory device 10 via a first power rail, and second power having a second voltage is supplied from a second host power supply in the host 5 to the removable memory device 10 via a second power rail.

As illustrated in FIG. 2A, the removable memory device 10 has a package (i.e., main body) 11 having the shape of a thin plate. The main body 11 of the removable memory device 10 is formed into the shape of, for example, a substantially rectangular plate extending in the Y-axis direction. The Y-axis direction is the longitudinal direction of the main body 11 of the removable memory device 10.

The main body 11 has the shape of a plate, and comprises a first surface 21, a second surface 22, and a side surface 23. The first surface 21 and the second surface 22 are formed into a substantially quadrilateral (e.g., rectangular) shape extending in the Y-axis direction. That is, the Y-axis direction is also the longitudinal direction of the first surface 21 and the second surface 22.

The first surface 21 is a substantially flat surface facing in the positive direction of the Z-axis. The second surface 22 is opposite to the first surface 21, and is a substantially flat surface facing in the negative direction of the Z-axis.

The side surface 23 is provided between the first surface 21 and the second surface 22, and comprises a first edge 31, a second edge 32, a third edge 33, a fourth edge 34, a first corner portion 35, a second corner portion 36, a third corner portion 37, and a fourth corner portion 38.

The first edge 31 extends in the X-axis direction and faces in the positive direction of the Y-axis. The X-axis direction is the short-side direction of the main body 11, the first surface 21, and the second surface 22, and includes the positive direction and the negative direction of the X-axis.

The second edge 32 extends in the Y-axis direction and faces in the negative direction of the X-axis. The third edge 33 is opposite to the second edge 32, extends in the Y-axis direction, and faces in the positive direction of the X-axis. The fourth edge 34 is opposite to the first edge 31, extends in the X-axis direction, and faces in the negative direction of the Y-axis.

The respective lengths of the second edge 32 and the third edge 33 are longer than those of the first edge 31 and the fourth edge 34. The first edge 31 and the fourth edge 34 form short edges of the substantially rectangular removable memory device 10, and the second edge 32 and the third edge 33 form long edges (i.e., side edges) of the substantially rectangular removable memory device 10.

The first corner portion 35 is a corner portion between the first edge 31 and the second edge 32, and connects the end in the negative direction of the X-axis of the first edge 31 and the end in the positive direction of the Y-axis of the second edge 32.

The first corner portion 35 extends straight between the end in the negative direction of the X-axis of the first edge 31 and the end in the positive direction of the Y-axis of the second edge 32. The first corner portion 35 is provided by cutting off the corner between the first edge 31 and the second edge 32 into a chamfer at 45 degrees such that each of X and Y lengths is 1.10 mm. In other words, the first corner portion 35 is provided by forming the corner between the first edge 31 and the second edge 32 into what is called corner chamfering of C1.10 (also referred to as C chamfering).

The second corner portion 36 is a corner portion between the first edge 31 and the third edge 33, and connects the end in the positive direction of the X-axis of the first edge 31 and the end in the positive direction of the Y-axis of the third edge 33. The second corner portion 36 extends in the shape of an arc between the end in the positive direction of the X-axis of the first edge 31 and the end in the positive direction of the Y-axis of the third edge 33. The second corner portion 36 is provided by forming the corner between the first edge 31 and the third edge 33 into a round with a radius of 0.20 mm. In other words, the second corner portion 36 is provided by forming the corner between the first edge 31 and the third edge 33 into what is called round chamfering of R0.20 (also referred to as R chamfering). In this manner, the shape of the first corner portion 35 and the shape of the second corner portion 36 are different from each other.

The third corner portion 37 connects the end in the negative direction of the Y-axis of the second edge 32 and the end in the negative direction of the X-axis of the fourth edge 34. The fourth corner portion 38 connects the end in the negative direction of the Y-axis of the third edge 33 and the end in the positive direction of the X-axis of the fourth edge 34. The third corner portion 37 and the fourth corner portion 38 each extend in the shape of an arc as in the case of the second corner portion 36.

Tolerance for the length is defined ±0.10 mm. The length in the Y-axis direction of the main body 11, the first surface 21, and the second surface 22 is set to approximately 18±0.10 mm, and their length in the X-axis direction is set to approximately 14±0.10 mm. That is, the distance between the first edge 31 and the fourth edge 34 in the Y-axis direction is set to approximately 18±0.10 mm, and the distance between the second edge 32 and the third edge 33 in the X-axis direction is set to approximately 14±0.10 mm. The lengths in the X-axis direction and the Y-axis direction of the main body 11, the first surface 21, and the second surface 22 are not limited to this example.

The thickness in the Z-axis direction of the main body 11 is set to approximately 1.4 mm±0.10 mm. That is, the distance between the first surface 21 and the second surface 22 in the Z-axis direction is set to approximately 1.4 mm±0.10 mm.

As illustrated in FIG. 2B, the main body 11 further comprises an inclined portion 39. The inclined portion 39 is a corner portion between the first surface 21 and the first edge 31, and extends straight between the end in the positive direction of the Y-axis of the first surface 21 and the end in the positive direction of the Z-axis of the first edge 31.

As illustrated in FIG. 2A, the first surface 21 of the removable memory device 10 is provided with terminals. The terminals are also referred to as external connection terminals. In FIG. 2A, the terminals are denoted by small rectangles. Although not illustrated in the figure, they may be squares.

The terminals are, for example, arranged in three rows of a first row R1, a second row R2, and a third row R3. The terminal group arranged in the first row R1 is referred to as a first-row terminal group. The first-row terminal group, for example, includes signal terminals for transmitting and receiving differential signals of two lanes defined by the PCI Express (PCIe) (registered trademark) standard. The signal terminals corresponding to one lane include two terminals to which a pair of receiver differential signals is allocated and two terminals to which a pair of transmitter differential signals is allocated. Any of the two pair terminals of differential signals is surrounded by ground terminals. At least a ground terminal is interposed between the adjacent two pair terminals that are different lanes and different types (receiver or transmitter).

The terminal group in the second row R2 is referred to as a second-row terminal group. The second-row terminal group includes, for example, a power supply ground terminals and several signal terminals for option signals.

The terminal group in the third row R3 is referred to as a third-row terminal group. The third-row terminal group includes several signal terminals to which sideband signals (e.g., reset signal PERST #, clock request signal CLKREQ #) and reference clock pair (CLKREF) defined by the PCIe standard are allocated, one or more first power supply terminals supplied with first power having a first voltage, one or more second power supply terminals supplied with second power having a second voltage different from the first voltage, one or more power supply ground terminals, and several signal ground terminals.

FIG. 3 illustrates a configuration example of the removable memory device 10.

As illustrated in FIG. 3, a substrate 12, a NAND flash memory 13, and a controller 14 which controls the NAND flash memory 13 are provided in the main body 11 of the removable memory device 10. The NAND flash memory 13 and the controller 14 are mounted on a surface of the substrate 12. The NAND flash memory 13 includes NAND flash memory dies stacked on the surface of the substrate 12.

A back surface of the substrate 12 which is opposite to the surface of the substrate 12 is exposed and functions as the first surface 21. The terminals explained with reference to FIG. 2A are disposed on the back surface of the substrate 12.

The NAND flash memory 13 and the controller 14 are covered and sealed by a mold resin 40 molded to form the body (i.e., main body 11) of the removable memory device 10.

Figure 4:
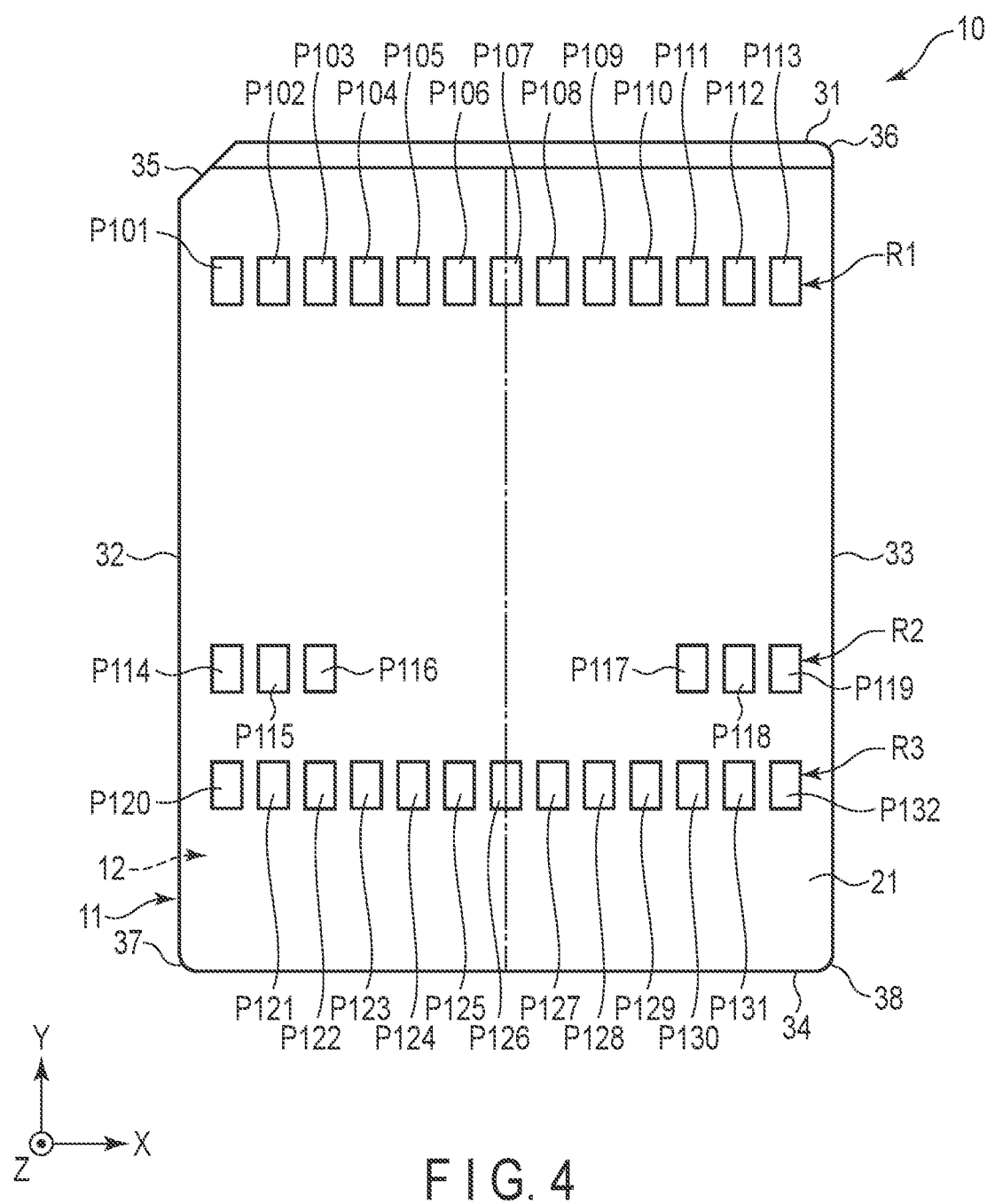
FIG. 4 is a plan view illustrating the outer shape of the removable memory device and an arrangement example of terminals according to the embodiment.

FIG. 4 is a plan view illustrating the outer shape of the removable memory device 10 and an arrangement example of terminals.

As illustrated in FIG. 4, the removable memory device 10 comprises the terminals P. The terminals P may be referred to as pads. FIG. 4 illustrates a case where the removable memory device 10 comprises thirty-two terminals P. This number is merely an example, and the number of terminals P is not limited to this example. That is, the number of terminals P may be less than thirty-two and may be greater than thirty-two. The terminals P are disposed on the back surface of the substrate 12 and exposed on the first surface 21. The second surface 22 is not provided with terminals P. The second surface 22 may be used as, for example, a marking area.

As illustrated in FIG. 4, the first-row terminal group arranged in the first row R1 includes thirteen terminals P101 to P113 arranged in the X-axis direction at intervals at positions closer to the first edge 31 than to the fourth edge 34. The terminals P101 to P113 are arranged in the X-axis direction along the first edge 31 in the vicinity of the first edge 31.

The second-row terminal group arranged in the second row R2 includes six terminals P114 to P119 arranged in the X-axis direction at intervals at positions closer to the fourth edge 34 than to the first edge 31. The terminals P114 to P116 are arranged in the X-axis direction along the fourth edge 34 at positions closer to the second edge 32 than to the third edge 33. The terminals P117 to 119 are arranged in the X-axis direction along the fourth edge 34 at positions closer to the third edge 33 than to the second edge 32. In other words, the terminals P114 to P116 are arranged between the second edge 32 and a central line (indicated by an alternate long and short dashed line) of the removable memory device 10 and the main body 11 in the X-axis direction, and the terminals P117 to 119 are arranged between the third edge 33 and the central line of the removable memory device 10 and the main body 11 in the X-axis direction. The interval between the terminal P116 and the terminal P117 belonging to the second-row terminal group is wider than the intervals between the other terminals that belong to the second-row terminal group and are adjacent to each other in the X-axis direction (specifically, the interval between the terminals P114 and P115, the interval between the terminals P115 and P116, the interval between the terminals P117 and P118, and the interval between the terminals P118 and P119).

The third-row terminal group arranged in the third row R3 includes thirteen terminals P120 to P132 arranged in the X-axis direction at intervals at positions closer to the fourth edge 34 than to the first edge 31. The terminals P120 to P132 belonging to the third row R3 are arranged closer to the fourth edge 34 than the terminals P114 to P119 belonging to the second row R2.

Figure 5:
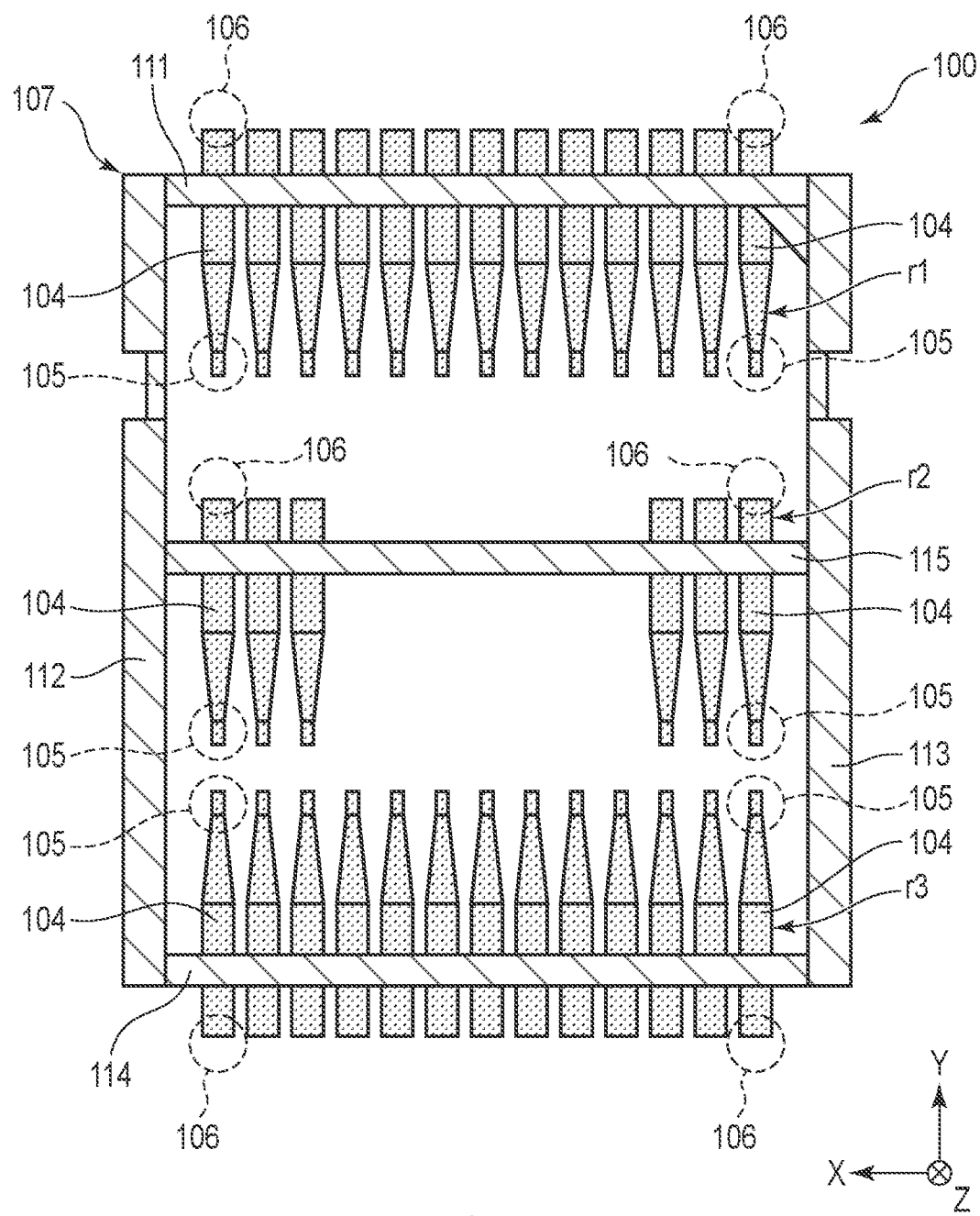
FIG. 5 is a plan view illustrating the outer shape of a socket to which the removable memory device is connected and an arrangement example of lead terminals according to the embodiment.

FIG. 5 is a plan view illustrating the outer shape of a socket 100 to which the removable memory device 10 is connected and an arrangement example of lead terminals.

In the socket 100, lead terminals 104 are arranged in three rows of rows r1, r2, and r3 so that they correspond to the first-row terminal group, the second-row terminal group, and the third-row terminal group of the removable memory device 10, respectively. The lead terminals may be referred as spring leads. The removable memory device 10 is placed on the socket 100 of FIG. 5 in a state in which the first surface 21 faces the lead terminals 104 of the socket 100.

In the first row r1, thirteen lead terminals 104 are arranged. Similarly, six lead terminals 104 are arranged in the second row r2 and thirteen lead terminals 104 are arranged in the third row r3.

One end of each lead terminal 104 includes a contact portion 105 which contacts the corresponding terminal of the removable memory device 10. For example, the contact portion 105 which contacts the first power supply terminal of the removable memory device 10 of the contact portions 105 functions as a first power supply terminal on the socket 100 side. In addition, for example, the contact portion 105 which contacts the second power supply terminal of the removable memory device 10 of the contact portions 105 functions as a second power supply terminal on the socket 100 side. Moreover, for example, the contact portion 105 which contacts the power supply ground terminal of the removable memory device 10 of the contact portions 105 functions as a power supply ground terminal on the socket 100 side. The other end of each lead terminal 104 includes a socket-board connecting portion 106 soldered to a footprint of a printed circuit board. The socket-board connecting portion 106 may be referred to as a soldering portion. Each lead terminal 104 is attached to a frame 107 of the socket 100.

The frame 107 of the socket 100 comprises a first edge 111, a second edge 112, a third edge 113, a fourth edge 114, and a connecting portion 115. The connecting portion 115 may not exist. The first edge 111, the second edge 112, the third edge 113, and the fourth edge 114 correspond to the upper, lower, left, and right four sides of the frame 107, which is rectangular. The connecting portion 115 connects a portion near the center of the second edge 112 and a portion near the center of the third edge 113 and reinforces the frame 107 of the socket 100. The connecting portion 115 may be referred to as a reinforcing portion and the connecting portion 115 may not exist if reinforcement is not required.

The thirteen lead terminals 104 in the first row r1 are attached to the first edge 111 of the frame 107. The six lead terminals 104 in the second row r2 are attached to the connecting portion 115 of the frame 107 or the second edge 112 and the third edge 113 of the frame 107. The position of the connecting portion 115 is determined by the position of the second row r2. The thirteen lead terminals 104 in the third row r3 are attached to the fourth edge 114 of the frame 107.

Figure 6:
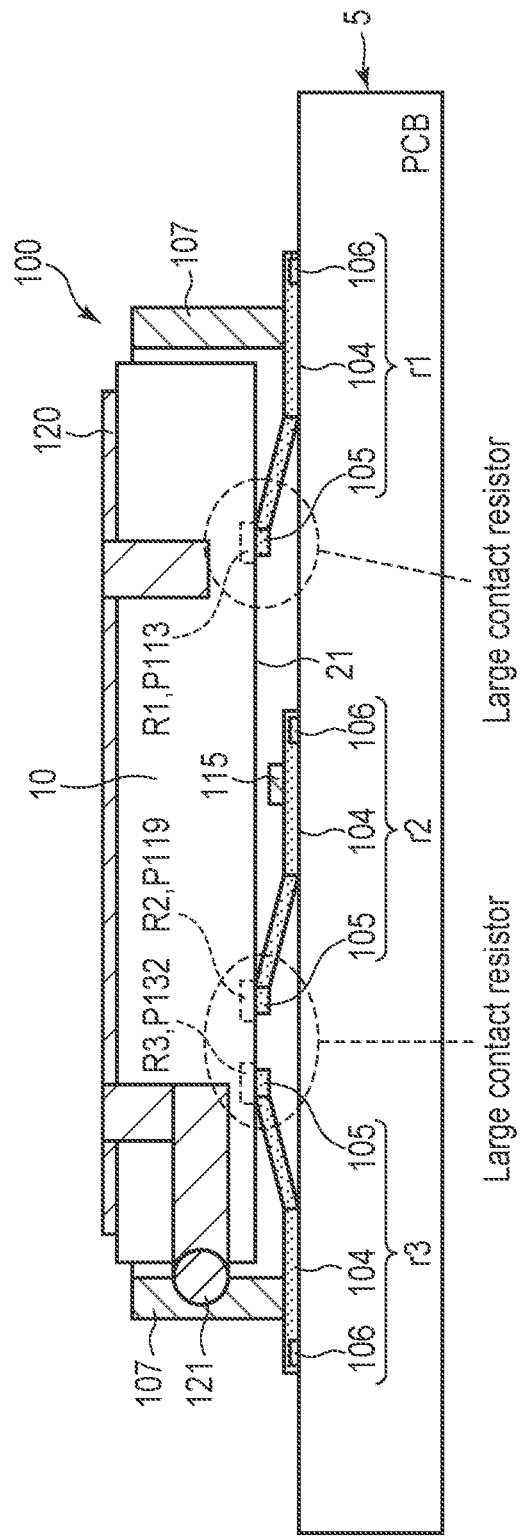
FIG. 6 is a side view illustrating the removable memory device connected to the socket according to the embodiment.

FIG. 6 is a side view illustrating the removable memory device 10 connected to the socket 100.

The removable memory device 10 is connectable to the socket 100. Thus, the socket 100 may be referred to as a connecting portion. Various types of socket, for example, a push-push socket, a push-pull socket, and a hinge socket, can be used as the socket 100. The socket 100, which is a hinge socket, is described herein as an example.

A cover 120 is attached to the frame 107 to turn around a shaft 121 functioning as a hinge portion. In a state where the cover 120 is raised to an open position, the removable memory device 10 is connected to the cover 120. In a state where the cover 120 is raised to an open position, the removable memory device 10 is connected to the cover 120 by, for example, inserting the removable memory device 10 into the cover 120. As illustrated in FIG. 6, when the cover 120 is closed, each of the terminals P on the first surface 21 of the removable memory device 10 contacts the contact portion 105 of the corresponding lead terminal 104 in the socket 100. The terminals P on the first surface 21 of the removable memory device 10 are thereby electrically connected to wires laid in the printed circuit board in the host 5 via the lead terminals 104.

In this manner, the removable memory device 10 is electrically connected to the printed circuit board in the host 5 via the lead terminals 104 of the socket 100. Accordingly, as in the case of a ball grid array (BGA) memory device, the number of terminals that can be placed in the removable memory device 10 is small compared to that of an embedded memory device with terminals directly soldered to a printed circuit board in a host. This limitation on the number of terminals also limits the number of power supply terminals per power supply. Thus, in the removable memory device 10, the value of a current flowing through one power supply terminal tends to be relatively large. For example, in the removable memory device 10, the maximum value of a current that can flow through one power supply terminal is set to 1.2 A. This value has been determined in consideration of the implementation of the socket 100, for example, design elements such as contact spring pressure, material, and the shape of a contact surface. For example, the socket 100 is implemented so that a drop voltage occurring between the contact portions 105 and the socket-board connecting portion 106 when the maximum current flows through the lead terminals 104 will be less than or equal to a predetermined voltage which is sufficiently small.

In addition, a contact resistance value exists between the terminals P of the removable memory device 10 and the contact portions 105 of the socket 100. More precisely, since the contact portions 105 are parts of the lead terminals 104, the contact resistance value exists between the terminals P of the removable memory device 10 and the lead terminals 104 of the socket 100. Because the terminals P and the lead terminals 104 are not attached together by soldering, the contact resistance value between the terminals P and the lead terminals 104 is relatively large. Moreover, a power supply wire connecting to a host power supply is provided in the printed circuit board in the host 5. The voltage value of power supplied from the host 5 to each power supply terminal of the removable memory device 10 decreases by a voltage drop due to the above contact resistance value and the wiring resistance value of the above power supply wire. The contact resistance value between the terminals P and the lead terminals 104 is also referred to as the contact resistance value of a device and a socket. Precisely, the contact length of the socket 100 is also short, but a resistance component exists. The explanation herein is simplified by considering the resistance component to be included in the contact resistance.

In this manner, the voltage drop due to the contact resistance value, the wiring resistance value, and the current flowing there though decreases the voltage value of power supplied to each power supply terminal of the removable memory device 10. Thus, the margin between the voltage value of power supplied to each power supply terminal and the minimum voltage value of power necessary to operate the removable memory device 10 tends to be relatively small.

An example of the power configuration of the removable memory device 10 will be explained next.

In this explanation, the removable memory device 10 having a two-power configuration, that is, the removable memory device 10 operating on two types of power will be explained.

Figures 7, 8:
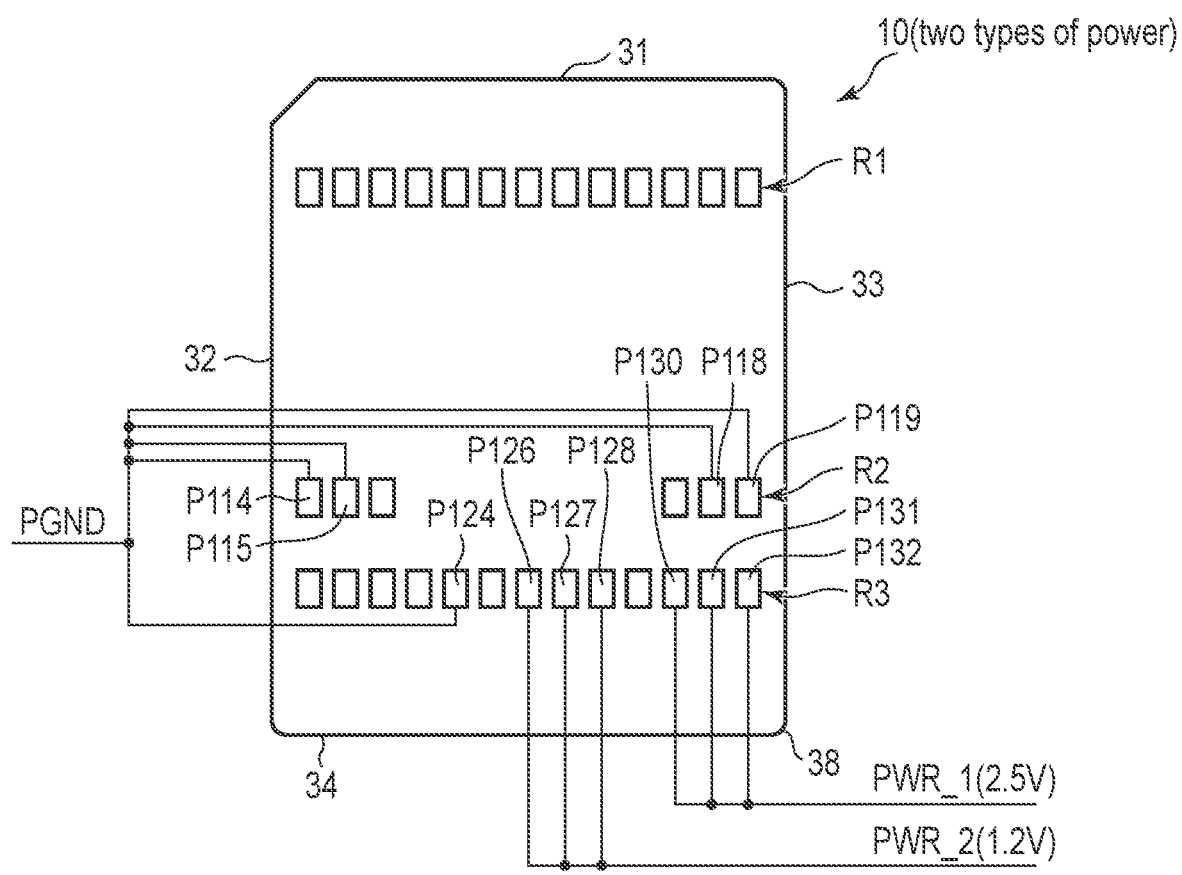
FIG. 7 illustrates an arrangement example of power supply terminals and power supply ground terminals of the removable memory device operating on two types of power according to the embodiment.
FIG. 8 illustrates the specifications of power supply voltages of the removable memory device operating on two types of power according to the embodiment.

FIG. 7 illustrates an arrangement example of power supply terminals and power supply ground terminals of the removable memory device 10 operating on two types of power. FIG. 7 illustrates a case where the number of power supply terminals supplied with first power is three, the number of power supply terminals supplied with second power is three, and the number of power supply ground terminals for return current is five. A total current of power supply currents supplied from the first power supply terminals and the second power supply terminals is returned from the power supply ground terminals to a first and a second power supply circuit. The signal ground terminals and the power supply ground terminals are equal in voltage level and electrically connected, but the removable memory device 10 can be designed by implementation so that no power supply current flows through the signal ground terminals. The number of power supply terminals supplied with the first power, the number of power supply terminals supplied with the second power, and the number of power supply ground terminals for return current are not limited to this example. The number of power supply terminals supplied with the first power may be any number greater than or equal to one, and the number of power supply terminals supplied with the second power may be any number greater than or equal to one. Furthermore, the number of power supply ground terminals for return current also may be any number greater than or equal to one.

The first power (PWR_1) is supplied to, for example, three terminals included in the third-row terminal group, specifically, the terminals P130, P131, and P132. The terminals P130, P131, and P132 function as power supply terminals for the first power (PWR_1). The terminals P130, P131, and P132 may be electrically connected to each other in the removable memory device 10. As described above, the maximum value of a current supplied to one power supply terminal is, for example, 1.2 A. Thus, the three power supply terminals for the first power (PWR_1) can be supplied with a maximum current of 3.6 A.

The second power (PWR_2) is supplied to, for example, three terminals included in the third-row terminal group, specifically, the terminals P126, P127, and P128. The terminals P126, P127, and P128 function as power supply terminals for the second power (PWR_2). The terminals P126, P127, and P128 may be electrically connected to each other in the removable memory device 10. As described above, the maximum value of a current supplied to one power supply terminal is, for example, 1.2 A. Thus, the three power supply terminals for the second power (PWR_2) can be supplied with a maximum current of 3.6 A.

Four terminals included in the second-row terminal group, specifically, the terminals P114, P115, P118, and P119, and the one terminal P124 included in the third-row terminal group function as power supply ground terminals for power supply ground (PGND) shared by the first power (PWR_1) and the second power (PWR_2). The terminals P114, P115, P118, P119, and P124 are electrically connected to each other in the removable memory device 10. As described above, the maximum value of a current supplied to one power supply terminal is, for example, 1.2 A. Thus, the five terminals functioning as the power supply ground terminals can be supplied with a maximum return current of 6.0 A. The power supply ground terminals are provided separately from the signal ground terminals. This means that the sum of the current of the first power (PWR_1) and the current of the second power (PWR_2) is 6.0 A at its maximum.

FIG. 8 illustrates the specifications of power supply voltages of the removable memory device 10 operating on two types of power.

The first power (i.e., power rail PWR_1) has, for example, a voltage of 2.5 V. 2.5 V is the nominal value of the voltage of the first power (PWR_1). In practice, the first power (PWR_1) has a permissible voltage fluctuation range (Voltage Range) corresponding to a power supply fluctuation rate. For example, the minimum value (Minimum) of the voltage of the first power (PWR_1) having a voltage of 2.5 V is set to 2.4 V, and the maximum value (Maximum) of the voltage of the first power (PWR_1) is set to 2.7 V. In this case, the minimum value (Minimum) and the maximum value (Maximum) are not symmetrical to the nominal value, which allows a margin of only 0.1 V for the minimum side while allowing a margin of 0.2 V for the maximum side.

The second power (i.e., power rail PWR_2) has, for example, a voltage of 1.2 V. 1.2 V is a voltage widely used as the voltage of power for interfaces of general memory devices. 1.2 V is the nominal value of the voltage of the second power (PWR_2). In practice, the second power (PWR_2) has a permissible voltage fluctuation range (Voltage Range) corresponding to a power supply fluctuation rate. For example, the minimum value (Minimum) of the voltage of the second power (PWR_2) having a voltage of 1.2 V is set to 1.14 V, and the maximum value (Maximum) of the voltage of the second power (PWR_2) is set to 1.26 V. In this case, the minimum value (Minimum) and the maximum value (Maximum) are symmetrical to the nominal value, which allows a margin of 0.06 V for both the minimum side and the maximum side. That is, this margin is much smaller than the margin of the first power (PWR_1) and more precise power is required.

FIG. 9 is a block diagram illustrating a power configuration example of the removable memory device 10 operating on two types of power.

The NAND flash memory 13 included in the removable memory device 10 includes a NAND interface circuit 131 and a memory cell array 132 which is referred to as a NAND cell array.

The NAND interface circuit 131 performs the operation of receiving a command sequence (e.g., read command sequence, write command sequence, and erase command sequence) and data from the controller 14, the operation of writing data to the NAND cell array on the basis of the received write command sequence, the operation of reading data from the NAND cell array on the basis of the received read command sequence, the operation of erasing data in units of a block on the basis of the received erase command sequence, and the operation of transmitting status and read data to the controller 14.

The memory cell array 132 includes blocks. Each of the blocks includes pages. Each of the blocks is a unit of the data erase operation. Each of the pages is a unit of the data write operation and the data read operation.

The first power (PWR_1) having 2.5 V is mainly used as power for operating the memory cell array 132. The second power (PWR_2) having 1.2 V is mainly used as power for operating the NAND interface circuit 131.

The controller 14 includes a physical layer (PHY-A) 141 including an analog circuit, core logic 142, a NAND interface circuit 143, a low drop output (LDO) regulator 144.

The physical layer (PHY-A) 141 communicates with the host 5 via a PCIe serial bus. More specifically, the physical layer (PHY-A) 141 communicates with the host 5, using PCIe signals (i.e., two pairs of differential signals per lane) of lanes (e.g., two lanes), and transmits and receives several PCIe sideband signals to and from the host 5.

The core logic 142 includes various types of logic for executing the internal operation of the controller 14. The core logic 142 performs, for example, the process of interpreting and executing a command from the host 5, an error correction code (ECC) encoding/decoding process, etc.

The NAND interface circuit 143 is an interface circuit which communicates with the NAND flash memory 13. The NAND interface circuit 143 performs the operation of transmitting a command sequence (e.g., read command sequence, write command sequence, and erase command sequence) and data to the NAND flash memory 13, and the operation of receiving status and read data from the NAND flash memory 13.

In the power configuration of FIG. 9, the first power (PWR_1) having 2.5 V is further used to generate internal power for operating the physical layer (PHY-A) 141 and internal power for operating the core logic 142.

More specifically, the first power (PWR_1) of 2.5 V is supplied to both the LDO regulator 144 and a DC/DC converter 151. The LDO regulator 144 converts the first power (PWR_1) of 2.5 V into a predetermined voltage (e.g., 1.8 V) lower than 2.5 V, and applies the predetermined voltage to the physical layer (PHY-A) 141 as internal power for operating the physical layer (PHY-A) 141. Since the physical layer (PHY-A) 141 is an analog circuit, the physical layer (PHY-A) 141 requires a stabilized power supply voltage and the LDO regulator 144, which is suitable for voltage stabilization, applies a voltage to the physical layer (PHY-A) 141. Because its current consumption is relatively small, a power loss due to the use of the LDO regulator 144 is small. The DC/DC converter 151 converts the first power (PWR_1) of 2.5 V into another predetermined voltage (e.g., 0.8 V) lower than 2.5 V, and applies the predetermined voltage to the core logic 142 as internal power for operating the core logic 142. The voltage of the core logic 142 is determined by the LSI technology adopted by the controller, and high-frequency operations require relatively large current consumption. Thus, the DC/DC converter 151 with high efficiency is preferable.

The current consumption value of the first power (PWR_1) in the removable memory device 10 is the sum of the current consumption values of the memory cell array 132, the core logic 142, and the physical layer (PHY-A) 141. Accordingly, the current consumption value of the first power (PWR_1) in the removable memory device 10 depends on the configurations of the memory cell array 132, the core logic 142, and the physical layer (PHY-A) 141, and the performance of the removable memory device 10.

The current consumption value of the second power (PWR_2) in the removable memory device 10 is the sum of the current consumption values of the NAND interface circuit 131 in the NAND flash memory 13 and the NAND interface circuit 143 in the controller 14. Accordingly, the current consumption value of the second power (PWR_2) in the removable memory device 10 depends on the configurations of the NAND interface circuits 131 and 143 and the performance of the removable memory device 10.

The power configuration of the host 5 will be explained next. The host power supply uses, for example, a step-down switching regulator. In the following description, the step-down switching regulator will be explained first with reference to FIG. 10.

FIG. 10 illustrates a configuration example of the step-down switching regulator.

The step-down switching regulator converts an input voltage Vi into an output voltage Vo lower than the input voltage Vi, and outputs the output voltage Vo. In the step-down switching regulator, a feedback wire Wf is drawn from a point of measurement Pf on the output side, and a feedback wire Wg is drawn from a point of measurement Pg on the power supply ground side. The feedback wires Wf and Wg are connected to a voltage divider VD. The voltage divider VD includes a series circuit in which a first resistor Re1 and a second resistor Re2 are connected in series. The voltage divider VD steps down the output voltage Vo to a feedback voltage Vfb, and outputs the feedback voltage Vfb to a switching controller SC. The feedback voltage Vfb is determined by the output voltage Vo and the resistance ratio between the first resistor Re1 and the second resistor Re2. The switching controller SC compares the feedback voltage Vfb output by the voltage divider VD with a reference voltage Vref output by a reference voltage generator RG, and controls the on/off states of a first switch SW1 and a second switch SW2 alternately to keep the average output voltage constant on the basis of the result of the comparison. The first switch SW1 may be referred to as a high-side switch, and the second switch SW2 may be referred to as a low-side switch.

When the first switch SW1 is on and the second switch SW2 is off, a current flowing through the first switch SW1 and an output inductor Lo flows from the input side to the output side as indicated by an arrow of an alternate long and short dashed line. At this time, energy according to the current is accumulated in the output inductor Lo. In addition, when the first switch SW1 is on and the second switch SW2 is off, a return current flows from the power supply ground side to the input side as indicated by an arrow of an alternate long and short dashed line. The magnitude of the return current is equal to that of the current flowing from the input side to the output side. When the first switch SW1 is turned off and the second switch SW2 is turned on, a current flowing through the second switch SW2 and the output inductor Lo flows from the power supply ground side to the output side as indicated by a broken line arrow. This current flows when the output inductor Lo discharges the accumulated energy, and decreases with time. In the step-down switching regulator, the above accumulation of energy in the output inductor Lo and the above discharge of energy from the output inductor Lo are performed alternately in accordance with the on/off states of the first switch SW1 and the second switch SW2. Switching controller SC manages both switches SW1 and SW2 not to turn on at the same time to prevent short circuit between Vi and GND of inputs.

The output voltage Vo can be approximately determined from the ratio between the period for which the first switch SW1 is on and the period for which the second switch SW2 is on (in other words, the period for which the first switch SW1 is off). More specifically, the output voltage Vo can be approximately determined on the basis of Equation (1). It should be noted that Equation (1) is a simplified equation based on the assumption that the voltages at both ends of the switches SW1 and SW2 are zero.

$$\text{Output voltage } Vo = \text{Input voltage } Vi \times \frac{\text{Period for which first switch } SW1 \text{ is on}}{\text{Period for which first switch } SW1 \text{ is on} + \text{Period for which second switch } SW2 \text{ is on}} \quad \text{Equation (1)}$$

The second member of Equation (1) is a member referred to as a duty ratio, and the output voltage Vo is kept constant by controlling the duty ratio.

In the step-down switching regulator, in order to control the above duty ratio, the feedback wire Wf is drawn from the point of measurement Pf and the feedback wire Wg is drawn from the point of measurement Pg, and the output voltage Vo is monitored. Wiring resistors also exist in the feedback wires Wf and Wg as a matter of course. However, the voltage divider VD, to which the feedback wires Wf and Wg are connected, includes the first resistor Re1 and the second resistor Re2 having high resistance, so that almost no current flows through the feedback wires Wf and Wg. That is, at the time of feedback, a voltage drop due to a wiring resistor Rf of the feedback wire Wf and a wiring resistor Rg of the feedback wire Wg can be made negligibly small. This enables precise feedback of the output voltage Vo and proper control of the above duty ratio. Since the voltage drop due to the wiring resistor Rf of the feedback wire Wf and the wiring resistor Rg of the feedback wire Wg is negligibly small, the above control of the duty ratio is not influenced even when the points of measurement Pf and Pg are located away from the switching controller SC and the feedback wires Wf and Wg are long.

Figure 11:
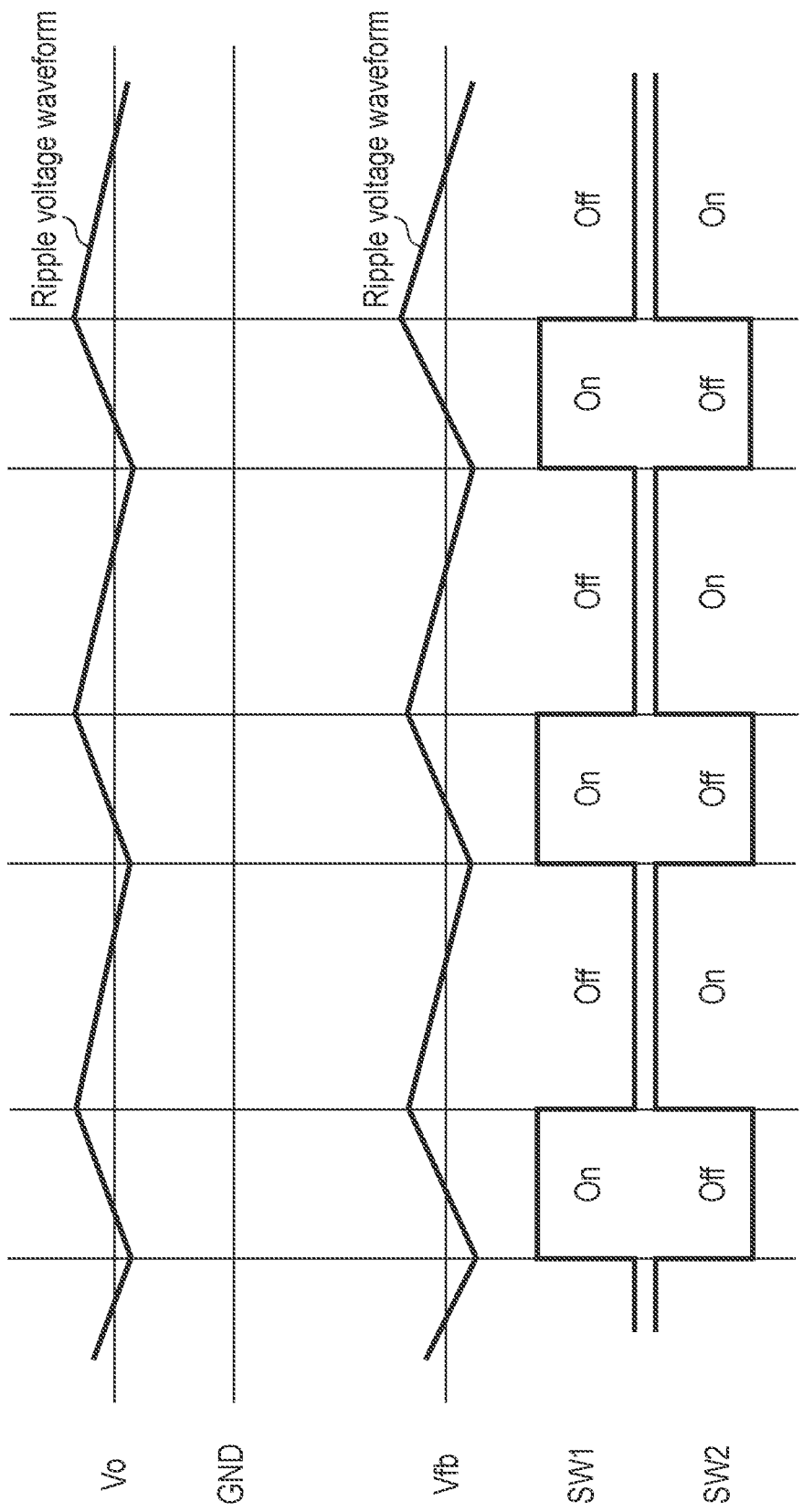
FIG. 11 is a waveform chart illustrating the relationship between the on/off states of a first switch and a second switch, an output voltage, and a feedback voltage illustrated in FIG. 10.

FIG. 11 is a waveform chart showing the relationship between the on/off states of the first switch SW1 and the second switch SW2, the output voltage Vo, and the feedback voltage Vfb illustrated in FIG. 10. When the first switch SW1 is on and the second switch SW2 is off, the output voltage Vo increases. Thus, the feedback voltage Vfb also increases as in the case of the output voltage Vo. The magnitude of the feedback voltage Vfb is compared with that of the reference voltage Vref. The feedback voltage Vfb has hysteresis characteristics with respect to the reference voltage Vref. Thus, when the feedback voltage Vfb has increased to some extent, the first switch SW1 is turned off and the second switch SW2 is turned on, so that the output voltage Vo decreases. Accordingly, the feedback voltage Vfb also decreases as in the case of the output voltage Vo. Similarly, because of the hysteresis characteristics with respect to the reference voltage Vref, when the feedback voltage Vfb has decreased to some extent, the second switch SW2 is turned off and the first switch SW1 is turned on, so that the output voltage Vo increases. The output voltage Vo is smoothed by an output capacitor Co illustrated in FIG. 10, and thus shows a ripple voltage waveform including slight voltage fluctuations. Thus, the feedback voltage Vfb also shows a ripple voltage waveform as in the case of the output voltage Vo. To stabilize the above control of the on/off states, hysteresis characteristics are required to some extent, which leads to occurrence of a ripple voltage. For this reason, the power supply circuit is designed so that the ripple voltage of the output voltage Vo becomes sufficiently small compared to, for example, voltages within the power supply voltage fluctuation range illustrated in FIG. 8.

Figure 12:
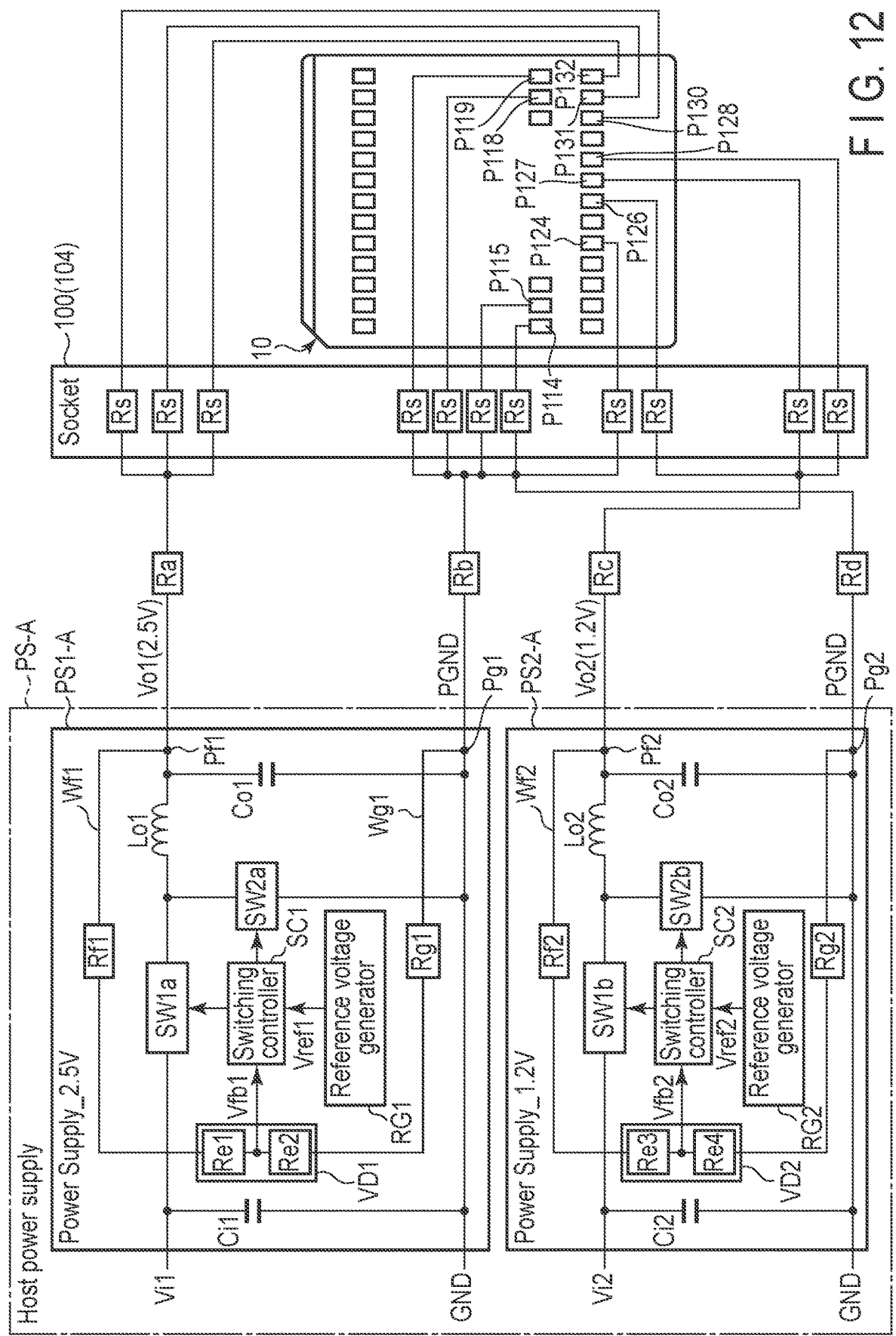
FIG. 12 illustrates a configuration example of a host power supply according to a comparative example which supplies two types of power to the removable memory device.

FIG. 12 is a diagram illustrating the configuration of a host power supply PS-A according to a comparative example which supplies two types of power to the removable memory device 10. The host power supply PS-A is a power supply circuit comprising a first host power supply PS1-A (Power Supply_2.5 V) which supplies first power of 2.5 V and a second host power supply PS2-A (Power Supply_1.2 V) which supplies second power of 1.2 V. In the first host power supply PS1-A and the second host power supply PS2-A, step-down switching regulators are used. An input voltage Vi1 of the first host power supply PS1-A is greater than 2.5 V, and an input voltage Vi2 of the second host power supply PS2-A is greater than 1.2 V. The input voltage Vi2 of the second host power supply PS2-A may be equal to the input voltage Vi1 of the first host power supply PS1-A. Because the basic configurations and operating principles of the step-down switching regulators have already been explained with reference to FIG. 10 and FIG. 11, their detailed explanation is omitted herein as appropriate.

In the configuration illustrated in FIG. 12, the feedback loops of the step-down switching regulators in the first host power supply PS1-A and the second host power supply PS2-A are closed in the respective host power supplies. That is, in the first host power supply PS1-A, a feedback wire Wf1 on the output side is drawn from a point of measurement Pf1 in the first host power supply PS1-A, and a feedback wire Wg1 on the power supply ground side is drawn from a point of measurement Pg1 in the first host power supply PS1-A. Similarly, in the second host power supply PS2-A, a feedback wire Wf2 on the output side is drawn from a point of measurement Pf2 in the second host power supply PS2-A, and a feedback wire Wg2 on the power supply ground side is drawn from a point of measurement Pg2 in the second host power supply PS2-A.

The first host power supply PS1-A monitors an output voltage Vo1 of the first host power supply PS1-A on the basis of feedback from the point of measurement Pf1 on the output side and the point of measurement Pg1 on the power supply ground side. A voltage divider VD1 in the first host power supply PS1-A steps down the output voltage Vo1 of the first host power supply PS1-A to a feedback voltage Vfb1, and outputs the feedback voltage Vfb1 to a switching controller SC1. The switching controller SC1 controls the on/off states of a first switch SW1a and a second switch SW2a on the basis of the feedback voltage Vfb1 and a reference voltage Vref1 output from a reference voltage generator RG1. Thus, with the output voltage Vo1 of the first host power supply PS1-A being monitored on the basis of feedback from the point of measurement Pf1 on the output side and the point of measurement Pg1 on the power supply ground side, the on/off states of the first switch SW1a and the second switch SW2a can be controlled, for example, in the following manner: when the feedback voltage Vfb1 generated from the output voltage Vo1 of the first host power supply PS1-A is lower than the reference voltage Vref1, the period for which the first switch SW1a is on is increased (i.e., the period for which the second switch SW2a is off is increased); and when the feedback voltage Vfb1 is higher than the reference voltage Vref1, the period for which the first switch SW1a is off is increased (i.e., the period for which the second switch SW2a is on is increased). Finally, the duty ratio approximates the above ratio of Equation (1).

Similarly, the second host power supply PS2-A monitors an output voltage Vo2 of the second host power supply PS2-A on the basis of feedback from the point of measurement Pf2 on the output side and the point of measurement Pg2 on the power supply ground side. A voltage divider VD2 in the second host power supply PS2-A steps down the output voltage Vo2 of the second host power supply PS2-A to a feedback voltage Vfb2 and outputs the feedback voltage Vfb2 to a switching controller SC2. The switching controller SC2 controls the on/off states of a first switch SW1b and a second switch SW2b on the basis of the feedback voltage Vfb2 and a reference voltage Vref2 output from a reference voltage generator RG2. Thus, with the output voltage Vo2 of the second host power supply PS2-A being monitored on the basis of feedback from the point of measurement Pf2 on the output side and the point of measurement Pg2 on the power supply ground side, the on/off states of the first switch SW1b and the second switch SW2b can be controlled, for example, in the following manner: when the feedback voltage Vfb2 generated from the output voltage Vo2 of the second host power supply PS2-A is lower than the reference voltage Vref2, the period for which the first switch SW1b is on is increased (i.e., the period for which the second switch SW2b is off is increased); and when the feedback voltage Vfb2 is higher than the reference voltage Vref2, the period for which the first switch SW1b is off is increased (i.e., the period for which the second switch SW2b is on is increased).

However, a voltage which is lower than the output voltage Vo1 by a voltage drop due to wiring resistors Ra and Rb of power supply wires connecting the first host power supply PS1-A and the socket 100 and contact resistors Rs of the socket 100 is applied to the terminals P130, P131, and P132, which function as the power supply terminals for the first power in the removable memory device 10. In addition, a voltage which is lower than the output voltage Vo2 by a voltage drop due to wiring resistors Rc and Rd of power supply wires connecting the second host power supply PS2-A and the socket 100 and contact resistors Rs of the socket 100 is applied to the terminals P126, 127, and 128, which function as the power supply terminals for the second power in the removable memory device 10. As described above, only the voltage drops due to the wiring resistors and the contact resistors are herein described. However, to be more precise, a voltage drop can further occur because of wiring inductance according to the transition of a current flowing through the power supply wires.

That is, even if the output voltage Vo1 of the first host power supply PS1-A is regulated on the basis of feedback from the points of measurement Pf1 and Pg1 in the first host power supply PS1-A, the voltage drop due to the above wiring resistors Ra and Rb and the above contact resistors Rs is not considered. Thus, a desired voltage (i.e., voltage within the permissible voltage fluctuation range) may not be applied to the power supply terminals for the first power of the removable memory device 10. Similarly, even if the output voltage Vo2 of the second host power supply PS2-A is regulated on the basis of feedback from the points of measurement Pf2 and Pg2 in the second host power supply PS2-A, the voltage drop due to the above wiring resistors Rc and Rd and the above contact resistors Rs is not considered. Thus, a desired voltage (i.e., voltage within the permissible voltage fluctuation range) may not be applied to the power supply terminals for the second power of the removable memory device 10. The current of the removable memory device 10 is larger, the voltage drop is larger. In particular, the voltage value of the second power is 1.2 V, and its permissible voltage fluctuation range is ±0.06 V, which is small. Thus, in the configuration shown in FIG. 12, it is likely that a desired voltage is not applied to the power supply terminals for the second power.

The configuration which can solve such a problem will be explained hereinafter.

Figure 13:
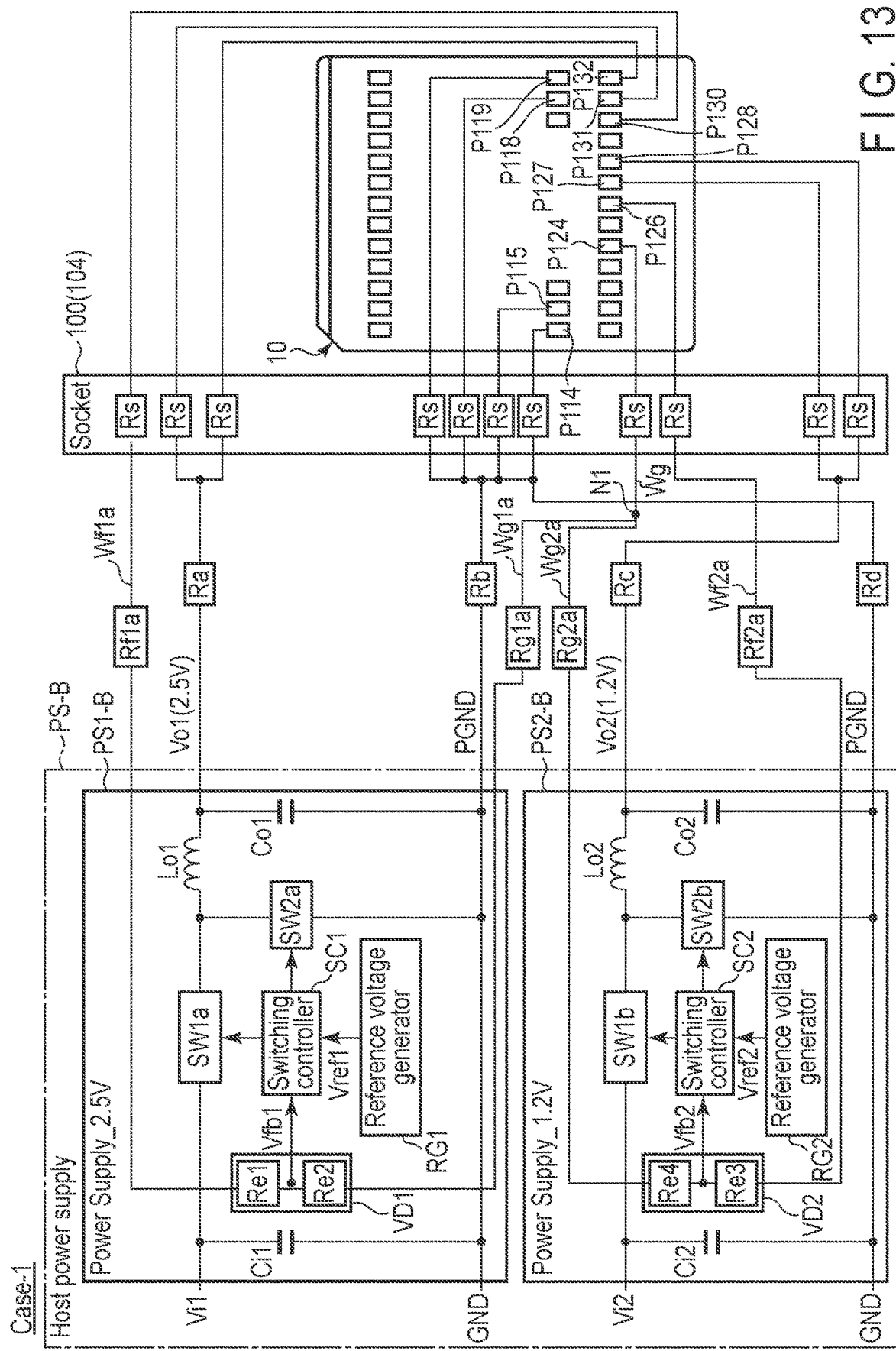
FIG. 13 illustrates a configuration example of a host power supply according to the embodiment which supplies two types of power to the removable memory device.

FIG. 13 is a diagram illustrating a configuration example of a host power supply PS-B according to the embodiment which supplies two types of power to the removable memory device 10. The configuration (Case-1) of FIG. 13 applies to cases where both the current consumption values of a first host power supply PS1-B (Power Supply_2.5 V) which supplies first power having a voltage of 2.5 V and a second host power supply PS2-B (Power Supply_1.2 V) which supplies second power having a voltage of 1.2 V are 2.0 A or less. The host power supply PS-B is also referred to as a power supply circuit. The first host power supply PS1-B is also referred to as a first host power supply circuit. The second host power supply PS2-B is also referred to as a second host power supply circuit. The maximum value of a current supplied to one power supply terminal of the removable memory device 10 is 1.2 A according to the standards. However, for the sake of convenience, the explanation herein leaves a margin and assumes that the practical maximum value of a current supplied to one power supply terminal is 1.0 A.

Since the current consumption value of the first host power supply PS1-B is 2.0 A or less and the maximum value of a current supplied to one power supply terminal is 1.0 A, two terminals are sufficient as the power supply terminals for the first power. Accordingly, in the present configuration, one of the three terminals functioning as the power supply terminals for the first power functions as a feedback terminal for feeding a voltage applied to the other two terminals back to the first host power supply PS1-B. That is, in the present configuration, this feedback terminal functions as a point of measurement on the output side of the first host power supply PS1-B. The other two terminals of the three terminals functioning as the power supply terminals for the first power are connected to a power supply wire (i.e., wire connected to an output node of 2.5 V against a power ground) for supplying the first power via the socket 100. FIG. 13 illustrates a case where, of the terminals P130, P131, and P132 (i.e., terminals P130, P131, and P132 to which 2.5 V can be applied) functioning as the power supply terminals for the first power, the terminal P130 functions as the feedback terminal for the first power and the terminals P131 and P132 function as the terminals connected to the power supply wire for supplying the first power. Alternatively, the terminal P131 or P132 may function as the feedback terminal for the first power instead of the terminal P130. To use one of these terminals for feedback, the terminals P130, P131, and P132 are electrically connected to each other in the removable memory device 10.

The lead terminal 104 of the socket 100 contacting the terminal P130, which is the feedback terminal for the first power, is connected to the voltage divider VD1 in the first host power supply PS1-B by a feedback wire Wf1a. The feedback wire Wf1a is longer than the feedback wire Wf1 illustrated in FIG. 12. Because the voltage divider VD1 has a high-resistance load, almost no current flow through the feedback wire Wf1a. Thus, a voltage drop due to the contact resistor Rs of the lead terminal 104 (i.e., contact portion 105) of the socket 100 contacting the terminal P130 and a wiring resistor Rf1a of the feedback wire Wf1a is negligibly small, and the voltage applied to the terminals P131 and P132 can be precisely fed back from the terminal P130 to the first host power supply PS1-B.

Similarly, since the current consumption value of the second host power supply PS2-B is 2.0 A or less and the maximum value of a current supplied to one power supply terminal is 1.0 A, two terminals are sufficient as the power supply terminals for the second power. Accordingly, in the present configuration, one of the three terminals functioning as the power supply terminals for the second power functions as a feedback terminal for feeding a voltage applied to the other two terminals back to the second host power supply PS2-B. That is, in the present configuration, this feedback terminal functions as a point of measurement on the output side of the second host power supply PS2-B. The other two terminals of the three terminals functioning as the power supply terminals for the second power are connected to a power supply wire (i.e., wire connected to an output node of 1.2 V against a power ground) for supplying the second power via the socket 100. FIG. 13 illustrates a case where, of the terminals P126, P127, and P128 (i.e., terminals P126, P127, and P128 to which 1.2 V can be applied) functioning as the power supply terminals for the second power, the terminal P126 functions as the feedback terminal for the second power and the terminals P127 and P128 function as the terminals connected to the power supply wire for supplying the second power. Alternatively, the terminal P127 or P128 may function as the feedback terminal for the second power instead of the terminal P126. To use one of these terminals for feedback, the terminals P126, P127, and P128 are electrically connected to each other in the removable memory device 10.

The lead terminal 104 of the socket 100 contacting the terminal P126, which is the feedback terminal for the second power, is connected to the voltage divider VD2 in the second host power supply PS2-B by a feedback wire Wf2a. The feedback wire Wf2a is longer than the feedback wire Wf2 illustrated in FIG. 12. Because the voltage divider VD2 has a high-resistance load, almost no current flow through the feedback wire Wf2a. Thus, a voltage drop due to the contact resistor Rs of the lead terminal 104 (i.e., contact portion 105) of the socket 100 contacting the terminal P126 and a wiring resistor Rf2a of the feedback wire Wf2a is negligibly small, and the voltage applied to the terminals P127 and P128 can be precisely fed back from the terminal P126 to the second host power supply PS2-B.

Moreover, both the current consumption values of the first host power supply PS1-B and the second host power supply PS2-B are 2.0 A or less, and it suffices if a maximum return current of 4.0 A flows. Accordingly, four terminals are sufficient as the power supply ground terminals shared by the first host power supply PS1-B and the second host power supply PS2-B. Thus, in the present configuration, one terminal of the five terminals functioning as the power supply ground terminals functions as a feedback terminal for the power supply ground. That is, this feedback terminal functions as a point of measurement on the power supply ground side. The other four terminals of the five terminals functioning as the power supply ground terminals are connected to a power supply ground wire (i.e., wire connected to a return node of a power ground) for supplying a return current via the socket 100. FIG. 13 illustrates a case where, of the terminals P114, P115, P118, P119, and P124 (i.e., terminals P114, P115, P118, P119, and P124 which can be connected to a ground level) functioning as the power supply ground terminals, the terminal P124 functions as the feedback terminal for the power supply ground and the terminals P114, P115, P118, and P119 function as the terminals connected to the power supply ground wire for supplying the return current. Alternatively, the terminals P114, P115, P118, or P119 may function as the feedback terminal for the power supply ground instead of the terminal P124.

The lead terminal 104 of the socket 100 contacting the terminal P124, which is the feedback terminal for the power supply ground, is connected to the voltage divider VD1 in the first host power supply PS1-B and the voltage divider VD2 in the second host power supply PS2-B by a feedback wire Wg. The feedback wire Wg branches into a feedback wire Wg1a and a feedback wire Wg2a at a node Ni in the vicinity of the socket 100.

The feedback wire Wg1a is connected to the voltage divider VD1 in the first host power supply PS1-B. The feedback wire Wg1a is longer than the feedback wire Wg1 illustrated in FIG. 12. Because the voltage divider VD1 has a high-resistance load, almost no current flows through the feedback wire Wg1a. Thus, a voltage drop due to the contact resistor Rs of the lead terminal 104 (i.e., contact portion 105) of the socket 100 contacting the terminal P124 and a wiring resistor Rg1a of the feedback wire Wg1a is negligibly small, and the voltage applied to the terminals P114, P115, P118, and P119 can be precisely fed back from the terminal P124 to the first host power supply PS1-B.

The feedback wire Wg2a is connected to the voltage divider VD2 in the second host power supply PS2-B. The feedback wire Wg2a is longer than the feedback wire Wg2 illustrated in FIG. 12. Because the voltage divider VD2 has a high-resistance load, almost no current flows through the feedback wire Wg2a. Thus, a voltage drop due to the contact resistor Rs of the lead terminal 104 (i.e., contact portion 105) of the socket 100 contacting the terminal P124 and a wiring resistor Rg2a of the feedback wire Wg2a is negligibly small, and the voltage applied to the terminals P114, P115, P118, and P119 can be precisely fed back from the terminal P124 to the second host power supply PS2-B.

The feedback wires Wf1a and Wg1a connected to the voltage divider VD1 in the first host power supply PS1-B are a pair of feedback wires and should preferably be drawn in parallel as in the case of a pair of differential wires. This can reduce inphase noise. To prevent inductive coupling with an output coil Lo1, the feedback wires Wf1a and Wg1a are laid and shielded in a different layer of a multilayered PCB or laid at a distance from the output coil Lo1. Similarly, the feedback wires Wf2a and Wg2a connected to the voltage divider VD2 in the second host power supply PS2-B are a pair of feedback wires and should preferably be drawn in parallel as in the case of a pair of differential wires. This can reduce inphase noise. To prevent inductive coupling with an output coil Lo2, the feedback wires Wf2a and Wg2a are laid and shielded in a different layer of a multilayered PCB or laid at a distance from the output coil Lo2.

The switching controller SC1 in the first host power supply PS1-B controls the on/off states of the first switch SW1a and the second switch SW2a and regulates the output voltage Vo1 to keep the voltage between the terminal P130, which functions as the feedback terminal for the first power, and the terminal P124, which functions as the feedback terminal for the power supply ground, constant. In other words, the switching controller SC1 in the first host power supply PS1-B controls the on/off states of the first switch SW1a and the second switch SW2a and regulates the output voltage Vo1 to keep the voltage between the feedback wires Wf1a and Wg1a constant, so that the voltage between the power supply terminals for the first power and the power supply ground terminals of the removable memory device 10 falls within the permissible voltage fluctuation range.

Similarly, the switching controller SC2 in the second host power supply PS2-B controls the on/off states of the first switch SW1b and the second switch SW2b and regulates the output voltage Vo2 to keep the voltage between the terminal P126, which functions as the feedback terminal for the second power, and the terminal P124, which functions as the feedback terminal as the power supply ground, constant. In other words, the switching controller SC2 in the second host power supply PS2-B controls the on/off states of the first switch SW1b and the second switch SW2b and regulates the output voltage Vo2 to keep the voltage between the feedback wires Wf2a and Wg2a constant, so that the voltage between the power supply terminals for the second power and the power supply ground terminals of the removable memory device 10 falls within the permissible voltage fluctuation range.

In the above-explained configuration (Case-1) illustrated in FIG. 13, one of the power supply terminals for the first power of the removable memory device 10 functions as the feedback terminal for the first power, one of the power supply terminals for the second power of the removable memory device 10 functions as the feedback terminal for the second power, and one of the power supply ground terminals of the removable memory device 10 functions as the feedback terminal for the power supply ground. With this configuration, the first power supply voltage and the second power supply voltage actually applied to the removable memory device 10 can be fed back to the host power supply PS-B. That is, the voltages influenced by the voltage drops due to the wiring resistors Ra, Rb, Rc, and Rd of the power supply wires and the contact resistors Rs of the socket 100 can be fed back. Thus, the output voltages Vo1 and Vo2 can be regulated to cancel the voltage drops due to the wiring resistors Ra, Rb, Rc, and Rd of the power supply wires and the contact resistors Rs of the socket 100. Accordingly, desired voltages (i.e., voltages within in the permissible voltage fluctuation ranges) can be stably applied to the power supply terminals for the first power and the power supply terminals for the second power of the removable memory device 10.

In the configuration (Case-1) illustrated in FIG. 13, the feedback wires Wf1*a* and Wg1*a* are a pair of feedback wires of the first host power supply PS1-B, and thus are also referred to as a pair of first feedback wires. In addition, the feedback wires Wf2*a* and Wg2*a* are a pair of feedback wires of the second host power supply PS2-B, and thus are also referred to as a pair of second feedback wires. In the configuration (Case-1) illustrated in FIG. 13, the feedback wire Wf1*a* is also referred to as the power supply side of the pair of first feedback wires. The feedback wire Wg1*a* is also referred to as the ground side of the pair of first feedback wires. The feedback wire Wf2*a* is also referred to as the power supply side of the pair of second feedback wires. The feedback wire Wg2*a* is also referred to as the ground side of the pair of second feedback wires. In addition, in the configuration (Case-1) illustrated in FIG. 13, the first switches SW1*a* and SW1*b* are both also referred to as a first switch circuit. The second switches SW2*a* and SW2*b* are both also referred to as a second switch circuit.

Figure 14:
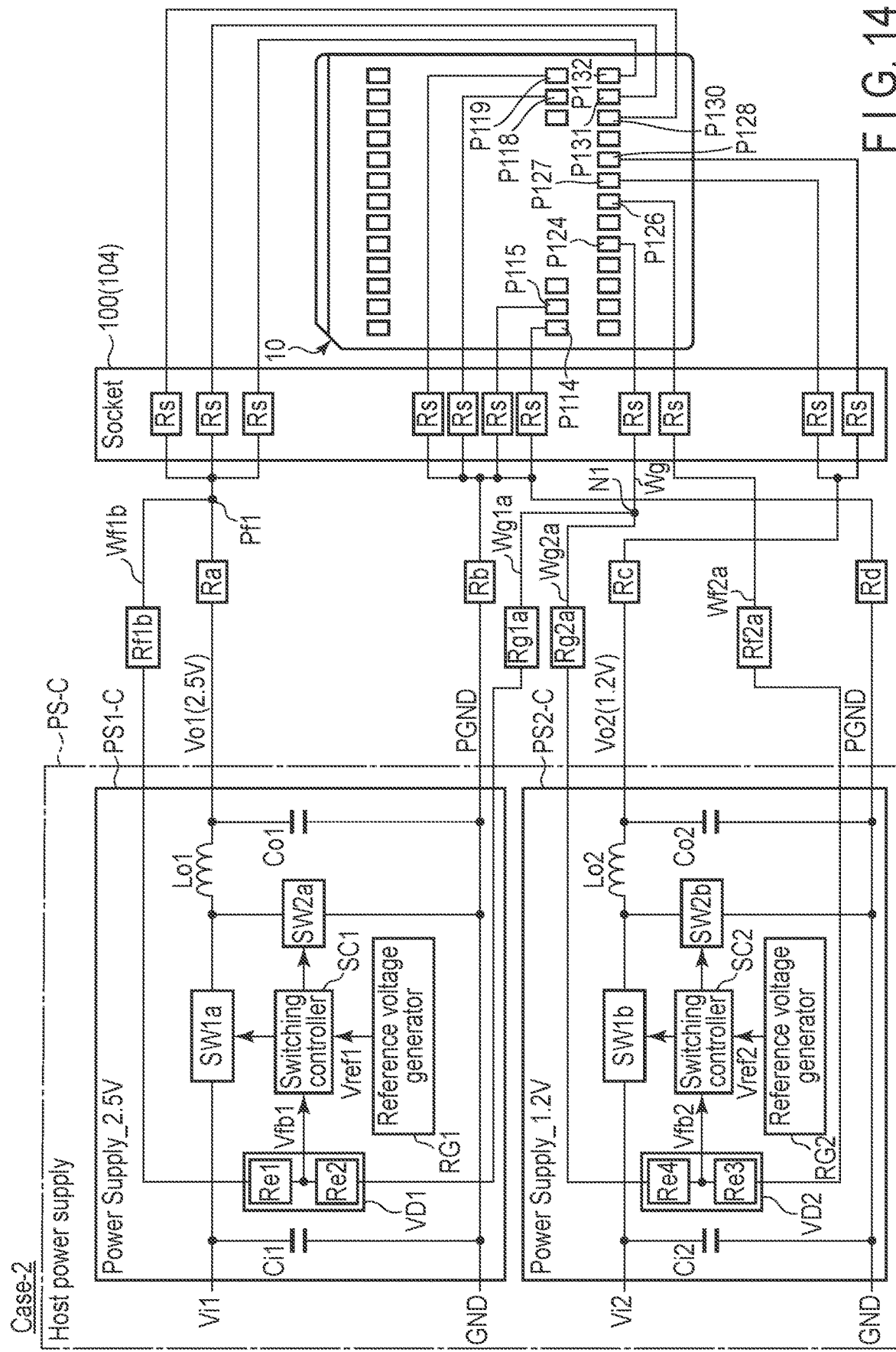
FIG. 14 illustrates another configuration example of the host power supply according to the embodiment which supplies two types of power to the removable memory device according to the embodiment.

FIG. 14 illustrates a configuration example of a host power supply PS-C which supplies two types of power to the removable memory device 10. The configuration (Case-2) of FIG. 14 applies to cases where the current consumption value of a first host power supply PS1-C (Power Supply_2.5 V) which supplies first power having a voltage of 2.5 V exceeds 2.0 A, the current consumption value of a second host power supply PS2-C (Power Supply_1.2 V) which supplies second power having a voltage of 1.2 V is 2.0 A or less, and the sum of the current consumption values of the first host power supply PS1-C and the second host power supply PS2-C is 4.0 A or less. The host power supply PS-C is also referred to as a power supply circuit. The first host power supply PS1-C is also referred to as a first host power supply circuit. The second host power supply PS2-C is also referred to as a second host power supply circuit. For the sake of convenience, the explanation herein also leaves a margin and assumes that the practical maximum value of a current supplied to one power supply terminal is 1.0 A.

Although the maximum value of a current supplied to one power supply terminal is 1.0 A, the current consumption value exceeds 2.0 A. Thus, three terminals are necessary as the power supply terminals for the first power. That is, in the present configuration, one of the three terminals functioning as the power supply terminals for the first power cannot function as a feedback terminal for the first power as in the case of the configuration (Case-1) of FIG. 13. Accordingly, in the first host power supply PS1-C, the point of measurement Pf1 on the output side is provided on the power supply wire for supplying the first power and in the vicinity of the lead terminals 104 of the socket 100 contacting the terminals P130, P131, and P132, which function as the power supply terminals for the first power, and a feedback wire Wf1*b* is drawn from the point of measurement Pf1. The vicinity of the lead terminals 104 where the point of measurement Pf1 on the output side is provided is, for example, the vicinity of a footprint connected to each of the lead terminals 104 and includes the socket-board connecting portions 106 of the lead terminals 104. In this case, the terminals P130, P131, and P132 are not necessary to be electrically connected to each other in the removable memory device 10. On the other hand, the terminals P126, P127, and P128 need to be electrically connected to each other in the removable memory device 10.

The feedback wire Wf1*b* is connected to the voltage divider VD1 in the first host power supply PS1-C. The feedback wire Wf1*b* is longer than the feedback wire Wf1 illustrated in FIG. 12. Because the voltage divider VD1 has a high-resistance load, almost no current flows through the feedback wire Wf1*b*. Thus, a voltage drop due to a wiring resistor Rf1*b* of the feedback wire Wf1*b* is negligibly small, and the voltage at the point of measurement Pf1 can be precisely fed back to the first host power supply PS1-C.

One of the power supply terminals for the second power functions as a feedback terminal for the second power and one of the power supply ground terminals functions as a feedback terminal for the power supply ground. In these points, the present configuration is identical to that of FIG. 13, and thus their detailed explanation is omitted herein.

The switching controller SC1 in the first host power supply PS1-C controls the on/off states of the first switch SW1*a* and the second switch SW2*a* and regulates the output voltage Vo1 to keep the voltage between the point of measurement Pf1 and the terminal P124, which functions as the feedback terminal for the power supply ground, constant. In other words, the switching controller SC1 in the first host power supply PS1-C controls the on/off states of the first switch SW1*a* and the second switch SW2*a* and regulates the output voltage Vo1 to keep the voltage between the feedback wires Wf1*b* and Wg1*a*, which is a pair of feedback wires, constant, so that the voltage between the power supply terminals for the first power and the power supply ground terminals of the removable memory device 10 falls within the permissible voltage fluctuation range.

In addition, the switching controller SC2 in the second host power supply PS2-C controls the on/off states of the first switch SW1*b* and the second switch SW2*b* and regulates the output voltage Vo2 to keep the voltage between the terminal P126, which functions as the feedback terminal for the second power, and the terminal P124, which functions as the feedback terminal for the power supply ground, constant.

The above-explained configuration (Case-2) illustrated in FIG. 14 cannot feed back the voltages applied to the terminals P130, P131, and P132, which function as the power supply terminals for the first power. On the other hand, with the feedback wire Wf1*b* drawn from the point of measurement Pf1 in the vicinity of the lead terminals 104 of the socket 100 contacting the terminals P130, P131, and P132, the voltage at the point of measurement Pf1 is fed back to the first host power supply PS1-C.

Accordingly, the voltage influenced by the voltage drop due to the wiring resistor Ra of the power supply wire for supplying the first power can be fed back, and thus the output voltage Vo1 can be regulated to cancel the voltage drop due to the wiring resistor Ra. In this case, since the voltages applied to the terminals P130, P131, and P132, which function as the power supply terminals for the first power, cannot be fed back as described above, the output voltage Vo1 cannot be regulated to cancel the voltage drop due to the contact resistors Rs of the socket 100 contacting the terminals P130, P131, and P132. However, the contact resistors Rs of the socket 100 contacting the terminals P130, P131, and P132 are connected in parallel, and total resistance is estimated one third of Rs (⅓Rs). The influence of the voltage drop due to these contact resistors ⅓Rs is small compared to the permissible voltage fluctuation range of 2.5 V. Thus, only by canceling the above voltage drop due to the wiring resistor Ra, a desired voltage (i.e., voltage within the permissible voltage fluctuation range) can be applied in a sufficiently stable manner. In addition, it is only required that a voltage within the permissible voltage fluctuation range be applied to the power supply terminals for the first power, and the margin of the permissible voltage fluctuation range of the first power having a voltage of 2.5 V is greater than that of the second power having a voltage of 1.2 V. Considering these points, it suffices only if the above voltage drop due to the wiring resistor Ra can be canceled.

Because the output voltage Vo2 output from the second host power supply PS2-C can be regulated as in the case of the configuration illustrated in FIG. 13, its detailed explanation is omitted herein.

In the configuration (Case-2) illustrated in FIG. 14, the feedback wires Wf1$b$ and Wg1$a$ are a pair of feedback wires of the first host power supply PS1-C, and thus are also referred to as a pair of first feedback wires. In addition, the feedback wires Wf2$a$ and Wg2$a$ are a pair of feedback wires of the second host power supply PS2-C, and thus are also referred to as a pair of second feedback wires. In the configuration (Case-2) illustrated in FIG. 14, the feedback wire Wf1$b$ is also referred to as the power supply side of the pair of first feedback wires. The feedback wire Wg1$a$ is also referred to as the ground side of the pair of first feedback wires. The feedback wire Wf2$a$ is also referred to as the power supply side of the pair of second feedback wires. The feedback wire Wg2$a$ is also referred to as the ground side of the pair of second feedback wires. In addition, in the configuration (Case-2) illustrated in FIG. 14, the first switches SW1$a$ and SW1$b$ are both also referred to as a first switch circuit. The second switches SW2$a$ and SW2$b$ are both also referred to as a second switch circuit.

Figure 15:
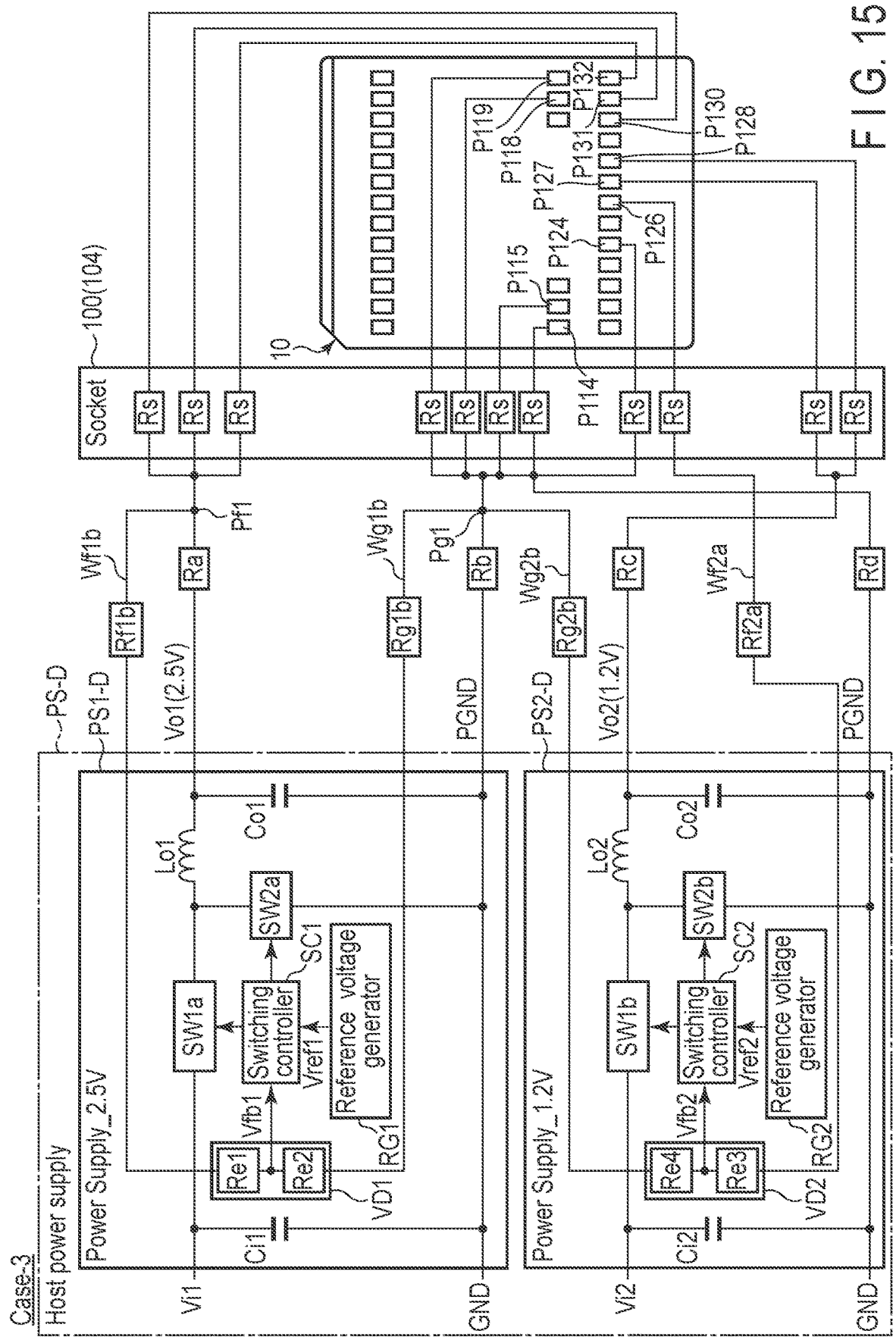
FIG. 15 illustrates still another configuration example of the host power supply according to the embodiment which supplies two types of power to the removable memory device according to the embodiment.

FIG. 15 illustrates a configuration example of a host power supply PS-D which supplies two types of power to the removable memory device 10. The configuration (Case-3) of FIG. 15 applies to cases where the current consumption value of a first host power supply PS1-D (Power Supply_2.5 V) supplying first power having a voltage of 2.5 V exceeds 2.0 A, the current consumption value of a second host power supply PS2-D (Power Supply_1.2 V) supplying second power having a voltage of 1.2 V is 2.0 A or less, and the sum of the current consumption values of the first host power supply PS1-D and the second host power supply PS2-D exceeds 4.0 A. The host power supply PS-D is also referred to as a power supply circuit. The first host power supply PS1-D is also referred to as a first host power supply circuit. The second host power supply PS2-D is also referred to as a second host power supply circuit. For the sake of convenience, the explanation herein also leaves a margin and assumes that the practical maximum value of a current supplied to one power supply terminal is 1.0 A.

Although the maximum value of a current supplied to one power supply terminal is 1.0 A, the current consumption value exceeds 2.0 A. Thus, three terminals are necessary as the power supply terminals for the first power. That is, in the present configuration, as in the case of the configuration (Case-2) of FIG. 14, the point of measurement Pf1 on the output side is provided on the power supply wire for supplying the first power and in the vicinity of the lead terminals 104 of the socket 100 contacting the terminals P130, P131, and P132, which function as the power supply terminals for the first power, and the feedback wire Wf1$b$ is drawn from the point of measurement Pf1.

The feedback wire Wf1$b$ is connected to the voltage divider VD1 in the first host power supply PS1-D. The feedback wire Wf1$b$ is longer than the feedback wire Wf1 illustrated in FIG. 12. Because the voltage divider VD1 has a high-resistance load, almost no current flows through the feedback wire Wf1$b$. Thus, a voltage drop due to the wiring resistor Rf1$b$ of the feedback wire Wf1$b$ is negligibly small, and the voltage at the point of measurement Pf1 can be precisely fed back to the first host power supply PS1-D.

In addition, since the sum of the current consumption values of the first host power supply PS1-D and the second host power supply PS2-D exceeds 4.0 A, five terminals are necessary as the power supply ground terminals. That is, in the present configuration, one of the five terminals functioning as the power supply ground terminals cannot function as a feedback terminal for the power supply ground as in the configuration (Case-1) of FIG. 13 and the configuration (Case-2) of FIG. 14. Thus, the point of measurement Pg1 on the power supply ground side is provided on the power supply wire for the power supply ground and in the vicinity of the lead terminals 104 of the socket 100 contacting the terminals P114, P115, P118, P119, and P124, which function as the power supply ground terminals, and a feedback wire Wg1$b$ on the power supply ground side connecting to the first host power supply PS1-D and a feedback wire Wg2$b$ on the power supply ground side connecting to the second host power supply PS2-D are drawn from the point of measurement Pg1. The vicinity of the lead terminals 104 where the point of measurement Pg1 on the power supply ground side is provided is, for example, the vicinity of a footprint connected to each of the lead terminals 104 and includes the socket-board connecting portions 106 of the lead terminals 104.

The feedback wire Wg1$b$ is connected to the voltage divider VD1 in the first host power supply PS1-D. The feedback wire Wg1$b$ is longer than the feedback wire Wg illustrated in FIG. 12. Because the voltage divider VD1 has a high-resistance load, almost no current flows through the feedback wire Wg1$b$. Thus, a voltage drop due to a wiring resistor Rg1$b$ of the feedback wire Wg1$b$ is negligibly small, and the voltage at the point of measurement Pg1 can be precisely fed back to the first host power supply PS1-D.

In addition, the feedback wire Wg2$b$ is connected to the voltage divider VD2 in the second host power supply PS2-D. The feedback wire Wg2$b$ is longer than the feedback wire Wg illustrated in FIG. 12. Because the voltage divider VD2 has a high-resistance load, almost no current flows through the feedback wire Wg2$b$. Thus, a voltage drop due to a wiring resistor Rg2$b$ of the feedback wire Wg2$b$ is negligibly small, and the voltage at the point of measurement Pg1 can be precisely fed back to the second host power supply PS2-D.

One of the power supply terminals for the second power functions as a feedback terminal for the second power. In this point, the present configuration is identical to those of FIG. 13 and FIG. 14, and thus its detailed explanation is omitted herein.

The switching controller SC1 in the first host power supply PS1-D controls the on/off states of the first switch SW1$a$ and the second switch SW2$a$ and regulates the output voltage Vo1 to keep the voltage between the points of measurement Pf1 and Pg1 constant. In other words, the switching controller SC1 in the first host power supply PS1-D controls the on/off states of the first switch SW1$a$ and the second switch SW2$a$ and regulates the output voltage Vo1 to keep the voltage between the feedback wires Wf1$b$ and Wg1$b$, which is a pair of feedback wires, constant, so that the voltage between the power supply terminals for the first power and the power supply ground terminals of the removable memory device 10 falls within the permissible voltage fluctuation range.

In addition, the switching controller SC2 in the second host power supply PS2-D controls the on/off states of the first switch SW1*b* and the second switch SW2*b* and regulates the output voltage Vo2 to keep the voltage between the terminal P126, which functions as the feedback terminal for the second power, and the point of measurement Pg1, constant. In other words, the switching controller SC2 in the second host power supply PS2-D controls the on/off states of the first switch SW1*b* and the second switch SW2*b* and regulates the output voltage Vo2 to keep the voltage between the feedback wires Wf2*a* and Wg2*b*, which is a pair of feedback wires, constant, so that the voltage between the power supply terminals for the second power and the power supply ground terminals of the removable memory device 10 falls within the permissible voltage fluctuation range.

The above-explained configuration (Case-3) illustrated in FIG. 15 cannot feed back the voltages applied to the terminals P130, P131, and P132, which function as the power supply terminals for the first power, and the voltages applied to the terminals P114, P115, P118, P119, and P124, which functions as the power supply ground terminals.

However, with the feedback wire Wf1*b* drawn from the point of measurement Pf1, which is provided in the vicinity of the lead terminals 104 of the socket 100 contacting the terminals P130, P131, and P132, the voltage at the point of measurement Pf1 is fed back to the first host power supply PS1-D. In addition, with the feedback wires Wg1*b* and Wg2*b* drawn from the point of measurement Pg1, which is provided in the vicinity of the lead terminals 104 of the socket 100 contacting the terminals P114, P115, P118, P119, and P124, the voltage at the point of measurement Pg1 is fed back to the first host power supply PS1-D and the second host power supply PS2-D.

Accordingly, in the first host power supply PS1-D, the output voltage Vo1 can be regulated to cancel the voltage drop due to the wiring resistors Ra and Rb of the power supply wires. In this case, the output voltage Vo1 cannot be regulated to cancel the voltage drop due to the contact resistors Rs of the socket 100 contacting the terminals P130, P131, and P132, which function as the power supply terminals for the first power, and the voltage drop due to the contact resistors Rs of the socket 100 contacting the terminals P114, P115, P118, P119, and P124, which function as the power supply ground terminals. However, the contact resistors Rs of the socket 100 contacting the power supply terminals for the first power are connected in parallel, total resistance is estimated at one third of Rs (⅓Rs) and the contact resistors Rs of the socket 100 contacting the power supply ground terminals are connected in parallel, total resistance is estimated at one fifth of Rs (⅕Rs). The influence of the voltage drop due to the contact resistors Rs is small compared to the permissible voltage fluctuation range of 2.5 V. Thus, only by canceling the above voltage drop due to the wiring resistors Ra and Rb, and the contact resistors Rs of P114, P115, P118 and P119, a desired voltage (i.e., voltage within the permissible voltage fluctuation range) can be applied in a sufficiently stable manner. In addition, it is only required that a voltage within the permissible voltage fluctuation range be applied to the power supply terminals for the first power, and the margin of the permissible voltage fluctuation range of the first power having a voltage of 2.5 V is greater than that of the second power having a voltage of 1.2 V. Considering these points, it suffices only if the above voltage drop due to the wiring resistors Ra and Rb can be canceled.

Moreover, the second host power supply PS2-D can regulate the output voltage Vo2 to cancel the voltage drop due to the wiring resistors Rc and Rd of the power supply wires and the voltage drop due to the contact resistors Rs of the socket 100 contacting the terminals P126, 127, and 128, which function as the power supply terminals for the second power. In this case, the output voltage Vo2 cannot be regulated to cancel the voltage drop due to the contact resistors Rs of the socket 100 contacting the terminals P114, P115, P118, P119, and P124, which function as the power supply ground terminals. However, the contact resistors Rs of the socket 100 contacting the power supply ground terminals are connected in parallel, total resistance is estimated at one fifth of Rs (⅕Rs). The influence of the voltage drop due to the contact resistors Rs is small compared to the permissible voltage fluctuation range of 1.2 V. Thus, only by canceling the above voltage drop due to the wiring resistors Rc and Rd, and the contact resistors Rs of P127 and P128, a desired voltage (i.e., voltage within the permissible voltage fluctuation range) can be applied in a sufficiently stable manner.

In the configuration (Case-3) illustrated in FIG. 15, the feedback wires Wf1*b* and Wg1*b* are a pair of feedback wires of the first host power supply PS1-D, and thus are also referred to as a pair of first feedback wires. In addition, the feedback wires Wf2*a* and Wg2*b* are a pair of feedback wires of the second host power supply PS2-D, and thus are also referred to as a pair of second feedback wires. In the configuration (Case-3) illustrated in FIG. 15, the feedback wire Wf1*b* is also referred to as the power supply side of the pair of first feedback wires. The feedback wire Wg1*b* is also referred to as the ground side of the pair of first feedback wires. The feedback wire Wf2*a* is also referred to as the power supply side of the pair of second feedback wires. The feedback wire Wg2*b* is also referred to as the ground side of the pair of second feedback wires. In addition, in the configuration (Case-3) illustrated in FIG. 15, the first switches SW1*a* and SW1*b* are both also referred to as a first switch circuit. The second switches SW2*a* and SW2*b* are both also referred to as a second switch circuit.

According to the above-described at least one embodiment, the host power supplies PS-B, PS-C, and PS-D receive feedback of the voltage actually applied to at least one terminal from the at least one terminal of the terminals P placed in the removable memory device 10, and can regulate the output voltage on the basis of the feedback. Accordingly, a desired voltage (i.e., voltage within the permissible voltage fluctuation range) can be stably applied to the removable memory device 10, compared to that in the host power supply PS-A according to the comparative example.

While certain embodiments have been described, these embodiments have been presented by way of example only, and are not intended to limit the scope of the inventions. Indeed, the novel devices and methods described herein may be embodied in a variety of other forms; furthermore, various omissions, substitutions and changes in the form of the embodiments described herein may be made without departing from the spirit of the inventions. The accompanying claims and their equivalents are intended to cover such forms or modification as would fall within the scope and spirit of the inventions.

What is claimed is:

1. An information processing apparatus comprising:
a connecting portion connectable to a removable memory device; and
a power supply circuit configured to apply a first voltage and a second voltage different from the first voltage to the removable memory device,
the removable memory device including first power supply terminals to which the first voltage is applicable, second power supply terminals to which the second voltage is applicable, and power supply ground terminals connectable to a ground level, the first power supply terminals being electrically connected to each other, the power supply ground terminals being electrically connected to each other,
the power supply circuit comprising a first wire connected to an output node of the first voltage against a power ground, a second wire connected to an output node of the second voltage against the power ground, a ground wire connected to a return node of the power ground, and a pair of first feedback wires connected to inputs of a first voltage divider,
wherein
when the removable memory device is connected to the connecting portion, one of the pair of first feedback wires is electrically connected to one of the first power supply terminals via the connecting portion, and the first wire is electrically connected to another terminal of the first power supply terminals via the connecting portion,
when the removable memory device is connected to the connecting portion, the other of the pair of first feedback wires is electrically connected to one of the power supply ground terminals via the connecting portion, and the ground wire is electrically connected to another terminal of the power supply ground terminals via the connecting portion,
when the removable memory device is connected to the connecting portion, the second wire is electrically connected to at least one of the second power supply terminals via the connecting portion, and
when the removable memory device is connected to the connecting portion, the power supply circuit is configured to control the first voltage, based on a voltage between the pair of first feedback wires.

2. The information processing apparatus of claim 1, wherein
the removable memory device including the second power supply terminals being electrically connected to each other,
the power supply circuit comprises a pair of second feedback wires connected to inputs of a second voltage divider,
when the removable memory device is connected to the connecting portion, one of the pair of second feedback wires is electrically connected to one of the second power supply terminals via the connecting portion, and the second wire is electrically connected to another terminal of the second power supply terminals via the connecting portion,
the other of the pair of second feedback wires is electrically connected to the one of the power supply ground terminals via the connecting portion, and
when the removable memory device is connected to the connecting portion, the power supply circuit is configured to control the second voltage, based on a voltage between the pair of second feedback wires.

3. The information processing apparatus of claim 1, wherein
the power supply circuit comprises a pair of second feedback wires connected to inputs of a second voltage divider,
when the removable memory device is connected to the connecting portion, the second wire is electrically connected to all the second power supply terminals via the connecting portion, and one of the pair of second feedback wires is electrically connected to all the second power supply terminals via the connecting portion,
the other of the pair of second feedback wires is electrically connected to the one of the power supply ground terminals via the connecting portion, and
when the removable memory device is connected to the connecting portion, the power supply circuit is configured to control the second voltage, based on a voltage between the pair of second feedback wires.

4. The information processing apparatus of claim 2, wherein
the power supply circuit includes a first portion where the one and the other of the pair of first feedback wires extend in parallel, and a second portion where the one and the other of the pair of second feedback wires extend in parallel.

5. The information processing apparatus of claim 1, wherein
the number of first power supply terminals is three, the number of second power supply terminals is three, and the number of power supply ground terminals is five.

6. The information processing apparatus of claim 1, wherein
the second voltage is higher than the first voltage.

7. The information processing apparatus of claim 6, wherein
the first voltage is 1.2 V, and the second voltage is 2.5 V.

8. The information processing apparatus of claim 1, wherein
the power supply circuit includes a step-down switching regulator,
the switching regulator comprises the pair of first feedback wires, the first voltage divider, a reference voltage generator which generates a reference voltage, a switching controller connected to output of the first voltage divider and the reference voltage generator, and a first switch circuit and a second switch circuit controlled by the switching controller,
output of the first voltage divider is a feedback voltage based on the voltage between the pair of first feedback wires, and
the switching controller is configured to control the first voltage by using the first switch circuit and the second switch circuit, based on the feedback voltage and the reference voltage.

9. An information processing apparatus comprising:
first power supply terminals;
second power supply terminals;
first power supply ground terminals; and
a power supply circuit comprising a first node allowed to output a first voltage, a second node allowed to output a second voltage different from the first voltage, and a ground node for ground level of the first and second voltages,
wherein
the power supply circuit comprises a first wire connected to the first node, a second wire connected to the second node, a ground wire connected to the ground node, and a pair of first feedback wires, one of the pair of first feedback wires is connected to one of the first power supply terminals, and the first wire is connected to another terminal of the first power supply terminals, the other of the pair of first feedback wires is connected to one of the first power supply ground terminals, and the ground wire is connected to another terminal of the first power supply ground terminals, and the power supply circuit is configured to control the first voltage, based on a voltage of the one of the pair of first feedback wires based on a voltage of the another terminal of the first power supply terminals, and a voltage of the other of the pair of first feedback wires based on a voltage of the another terminal of the first power supply ground terminals.

10. The information processing apparatus of claim 9, wherein when the information processing apparatus is connected to a removable memory device, the first power supply terminals are connected to third power supply terminals of the removable memory device, respectively, the second power supply terminals are connected to fourth power supply terminals of the removable memory device, respectively, and the first power supply ground terminals are connected to second power supply ground terminals of the removable memory device, respectively, and the third power supply terminals are electrically connected to each other in the removable memory device, and the second power supply ground terminals are electrically connected to each other in the removable memory device.

11. An information processing apparatus comprising:

a connecting portion connectable to a removable memory device; and a power supply circuit configured to apply a first voltage and a second voltage different from the first voltage to the removable memory device, the removable memory device including first power supply terminals to which the first voltage is applicable, second power supply terminals to which the second voltage is applicable, and power supply ground terminals connectable to a ground level, the first power supply terminals being electrically connected to each other, the second power supply terminals being electrically connected to each other, the power supply ground terminals being electrically connected to each other, the power supply circuit comprising a first wire connected to an output node of the first voltage against a power ground, a second wire connected to an output node of the second voltage against the power ground, a ground wire connected to a return node of the power ground, and a pair of first feedback wires connected to inputs of a first voltage divider, wherein when the removable memory device is connected to the connecting portion, one of the pair of first feedback wires is electrically connected to one of the first power supply terminals via the connecting portion, and the first wire is electrically connected to another terminal of the first power supply terminals via the connecting portion, when the removable memory device is connected to the connecting portion, the ground wire is electrically connected to all the power supply ground terminals via the connecting portion, and the other of the pair of first feedback wires is electrically connected to all the power supply ground terminals via the connecting portion, when the removable memory device is connected to the connecting portion, the second wire is electrically connected to all the second power supply terminals via the connecting portion, and when the removable memory device is connected to the connecting portion, the power supply circuit is configured to control the first voltage, based on a voltage between the pair of first feedback wires.

12. The information processing apparatus of claim 11, wherein the power supply circuit comprises a pair of second feedback wires connected to inputs of a second voltage divider, when the removable memory device is connected to the connecting portion, one of the pair of second feedback wires is electrically connected to all the second power supply terminals via the connecting portion, the other of the pair of second feedback wires is electrically connected to all the power supply ground terminals via the connecting portion, and when the removable memory device is connected to the connecting portion, the power supply circuit is configured to control the second voltage, based on a voltage between the pair of second feedback wires.

* * * * *